US007885112B2

(12) United States Patent  
Li et al.

(10) Patent No.: US 7,885,112 B2  
(45) Date of Patent: Feb. 8, 2011

(54) NONVOLATILE MEMORY AND METHOD FOR ON-CHIP PSEUDO-RANDOMIZATION OF DATA WITHIN A PAGE AND BETWEEN PAGES

(75) Inventors: Yan Li, Milpitas, CA (US); Yupin Kawing Fong, Fremont, CA (US); Nima Mokhlesi, Los Gatos, CA (US)

(73) Assignee: Sandisk Corporation, Milpitas, CA (US)

( * ) Notice: Subject to any disclaimer, the term of this patent is extended or adjusted under 35 U.S.C. 154(b) by 5 days.

(21) Appl. No.: 11/852,229

(22) Filed: Sep. 7, 2007

(65) Prior Publication Data

US 2009/0067244 A1   Mar. 12, 2009

(51) Int. Cl.  
*G11C 11/34* (2006.01)

(52) U.S. Cl. .................. 365/185.12; 365/185.02; 365/185.17; 365/185.19; 365/185.26

(58) Field of Classification Search ............ 365/185.17, 365/185.26, 185.12, 235, 185.02, 185.017, 365/185.19  
See application file for complete search history.

(56) References Cited

U.S. PATENT DOCUMENTS

| | | | |
|---|---|---|---|
| 4,357,685 | A | 11/1982 | Daniele et al. |
| 4,993,029 | A | 2/1991 | Galbraith et al. |
| 5,070,032 | A | 12/1991 | Yuan et al. |
| 5,095,344 | A | 3/1992 | Harari |
| 5,172,338 | A | 12/1992 | Mehrotra et al. |
| 5,313,421 | A | 5/1994 | Guterman et al. |
| 5,315,541 | A | 5/1994 | Harari et al. |
| 5,343,063 | A | 8/1994 | Yuan et al. |
| 5,418,752 | A | 5/1995 | Harari et al. |
| 5,570,315 | A | 10/1996 | Tanaka et al. |
| 5,595,924 | A | 1/1997 | Yuan et al. |
| 5,661,053 | A | 8/1997 | Yuan |

(Continued)

FOREIGN PATENT DOCUMENTS

EP    1 130 600 A    9/2001

(Continued)

OTHER PUBLICATIONS

EPO/ISA, "Invitation to Pay Additional Fees," corresponding International Patent Application No. PCT/US2008/073750, mailed on Dec. 30, 2008, 6 pages.

(Continued)

*Primary Examiner*—Pho M Luu  
*Assistant Examiner*—Tha-O Bui  
(74) *Attorney, Agent, or Firm*—Davis Wright; Tremaine LLP

(57) ABSTRACT

Features within an integrated-circuit memory chip enables scrambling or randomization of data stored in an array of nonvolatile memory cells. In one embodiment, randomization within each page helps to control source loading errors during sensing and floating gate to floating gate coupling among neighboring cells. Randomization from page to page helps to reduce program disturbs, user read disturbs, and floating gate to floating gate coupling that result from repeated and long term storage of specific data patterns. In another embodiment, randomization is implemented both within a page and between pages. The scrambling or randomization may be predetermined, or code generated pseudo randomization or user driven randomization in different embodiments. These features are accomplished within the limited resource and budget of the integrated-circuit memory chip.

23 Claims, 30 Drawing Sheets

U.S. PATENT DOCUMENTS

| | | | |
|---|---|---|---|
| 5,768,192 | A | 6/1998 | Eitan |
| 5,774,397 | A | 6/1998 | Endoh et al. |
| 5,903,495 | A | 5/1999 | Takeuchi et al. |
| 5,912,854 | A * | 6/1999 | Vogley et al. .......... 365/189.02 |
| 5,996,041 | A | 11/1999 | Kim |
| 6,011,725 | A | 1/2000 | Eitan |
| 6,046,935 | A | 4/2000 | Takeuchi et al. |
| 6,222,762 | B1 | 4/2001 | Guterman et al. |
| 6,266,273 | B1 | 7/2001 | Conley et al. |
| 6,657,891 | B1 | 12/2003 | Shibata et al. |
| 6,870,768 | B2 | 3/2005 | Cernea et al. |
| 6,983,428 | B2 | 1/2006 | Cernea |
| 7,006,379 | B2 * | 2/2006 | Noguchi et al. ........ 365/185.17 |
| 7,023,736 | B2 | 4/2006 | Cernea et al. |
| 7,073,103 | B2 | 7/2006 | Gongwer et al. |
| 7,120,051 | B2 | 10/2006 | Gorobets et al. |
| 7,230,851 | B2 | 6/2007 | Fong et al. |
| 7,251,160 | B2 | 7/2007 | Li et al. |
| 7,489,547 | B2 | 2/2009 | Moogat et al. |
| 7,549,011 | B2 | 6/2009 | Moschopoulos |
| 7,558,131 | B2 | 7/2009 | Han |
| 2004/0160829 | A1 * | 8/2004 | Tsujikawa et al. ..... 365/185.28 |
| 2005/0195635 | A1 | 9/2005 | Conley et al. |
| 2005/0257120 | A1 | 11/2005 | Gorobets et al. |
| 2006/0002190 | A1 | 1/2006 | Roohparvar |
| 2006/0031593 | A1 | 2/2006 | Sinclair |
| 2006/0062055 | A1 | 3/2006 | Sekiguchi et al. |
| 2006/0126390 | A1 | 6/2006 | Gorobets et al. |
| 2006/0136687 | A1 | 6/2006 | Conley et al. |
| 2006/0140007 | A1 | 6/2006 | Cernea et al. |
| 2006/1026390 | | 6/2006 | Gorobets et al. |
| 2006/0198195 | A1 | 9/2006 | Hemink et al. |
| 2006/0221696 | A1 | 10/2006 | Li |
| 2006/0233022 | A1 | 10/2006 | Li |
| 2006/0233023 | A1 | 10/2006 | Lin et al. |
| 2006/0233026 | A1 | 10/2006 | Li |
| 2006/0256618 | A1 * | 11/2006 | Nazarian ............... 365/185.17 |
| 2007/0097744 | A1 | 5/2007 | Li et al. |
| 2007/0261118 | A1 | 11/2007 | Lu |
| 2008/0065812 | A1 | 3/2008 | Li et al. |
| 2008/0065813 | A1 | 3/2008 | Li et al. |

FOREIGN PATENT DOCUMENTS

| | | |
|---|---|---|
| EP | 1 684 308 A | 7/2006 |
| JP | 07-240098 A | 9/1995 |
| JP | 2006-228407 A | 8/2006 |
| WO | WO 2006/107651 A1 | 10/2006 |

OTHER PUBLICATIONS

EPO/ISA, "Notification of Transmittal of the International Search Report and the Written Opinion of the International Searching Authority, or the Declaration," corresponding International Patent Application No. PCT/ US2008/073750, mailed on Feb. 25, 2009, 18 pages.

Eitan et al., "NROM: A Novel Localized Trapping, 2-Bit Nonvolatile Memory Cell," IEEE Electron Device Letters, vol. 21, No. 11, Nov. 2000, pp. 543-545.

EPO, "Examiner's Substantive Report," corresponding European Patent Application No. 08 830 722.8, mailed on Jul. 21, 2010, 2 pages.

* cited by examiner

Input Logic Truth Table

| Transfer Mode | ONE | ONEB<0> | ONEB<1> | PBus (Input) | BSI (Output) |
|---|---|---|---|---|---|
| Pass-Through | 1 | 0 | 0 | PBus | PBus |
| Invert | 0 | 1 | 1 | PBus | PBus* |
| Float | 1 | 1 | 0 | PBus | Float |

Output Logic Truth Table

| Transfer Mode | PINV | NINV | PDIR | NDIR | MTCH | PBus (Output) |
|---|---|---|---|---|---|---|
| Pass-Through | D | D | D | 1 | 0 | 0 |
| | 0 | D | D | D | 1 | 1 |
| Invert | D | D | 0 | D | 0 | 1 |
| | D | 1 | D | D | 1 | 0 |
| Float | D | D | D | D | X | Z |
| Pre-Charge | 0 | D | 0 | D | X | 1 |

(Default Values: PINV=1, NINV=0, PDIR=1, NDIR=0)

Multistate Memory (LM Gray Code)

| Register position | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|
| Code (polarity bit) | 1 | 0 | 1 | 0 | 0 | 1 | 1 | 1 | 1 | 0 | 0 | 0 | 1 | 1 | 0 | 1 | 0 |
| UD Original encoding | 0 | 1 | 0 | 1 | 0 | 1 | 0 | 1 | 0 | 1 | 0 | 1 | 0 | 1 | 0 | 1 | 0 |
| UD Subsequent encoding | 1 | 1 | 1 | 1 | 0 | 0 | 1 | 0 | 1 | 1 | 0 | 1 | 1 | 0 | 0 | 0 | 0 |
| State | ER | ER | B | | C | | ER | | A | | C | | B | | | | |

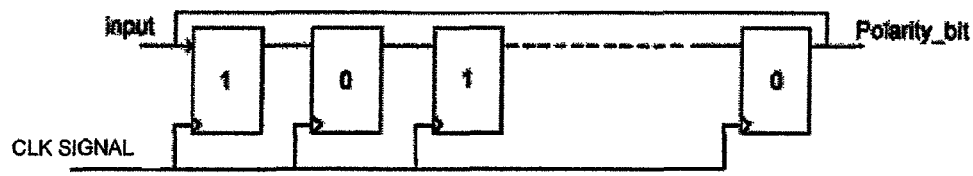
FIG. 23A
FIG. 23B
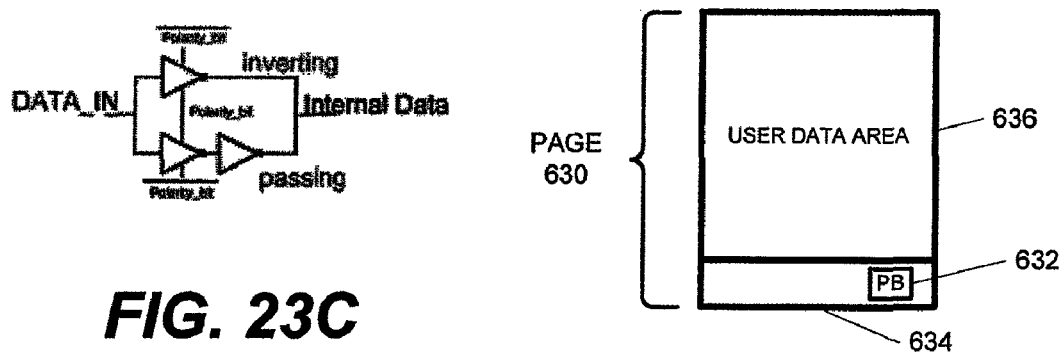
FIG. 23C
FIG. 23D
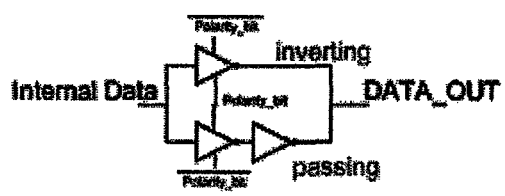
FIG. 23E

Scrambling of data in a page by shifting the starting location

|          | Col 0   | Col 1   | Col 2   | Col 3   |       | Col n-1 |
|----------|---------|---------|---------|---------|-------|---------|
| Page 0   | 0       | 1       | 2       | 3       | ----- | n-1     |
| Page 1   | n-1     | 0       | 1       | 2       | ----- | n-2     |
| Page 2   | n-2     | n-1     | 0       | 1       | ----- | n-3     |
| Page 3   | n-3     | n-2     | n-1     | 0       | ----- | n-4     |
| Page 4   | n-4     | n-3     | n-2     | n-1     | ----- | n-5     |
| ⋮        | ⋮       | ⋮       | ⋮       | ⋮       |       | ⋮       |
| Page m-1 | n-m+1   | n-m+2   | n-m+3   | n-m+4   | ----- | n-m     |

*Starting column*

FIG. 27

Randomizing bits within each page

Randomizing page-by-page and within each page

NONVOLATILE MEMORY AND METHOD FOR ON-CHIP PSEUDO-RANDOMIZATION OF DATA WITHIN A PAGE AND BETWEEN PAGES

FIELD OF THE INVENTION

The present invention relates generally to nonvolatile memory such as flash memory with charge storage elements, and more specifically to have the memory store data pseudo-randomly to avoid possible undesirable data patterns which could cause the memory to malfunction.

BACKGROUND

As the capacity of flash memory cards and drives increases, the scale of the memory cells within the memory array continues to decrease. Within a high density array, especially of the NAND variety, a charge stored in one cell or portion of the array may influence a read or program operation of a neighboring cell. This is what as known as a read or program disturb and cell coupling.

For further information on cell coupling, disturbs, and the operation and structure of NAND flash generally, please refer to U.S. patent application publication Nos.: US-2006-0233026-A1 entitled "Method for Non-Volatile Memory With Background Data Latch Caching During Program Operations"; US-2006-0233023-A1 entitled "Method for Non-Volatile Memory With Background Data Latch Caching During Erase Operations"; US-2006-0221696-A1, entitled "Method for Non-Volatile Memory With Background Data Latch Caching During Read Operations"; U.S. Pat. No. 6,870,768 entitled "Techniques for Reducing Effects of Coupling Between Storage Elements of Adjacent Rows of Memory Cells"; and US-2006-0140011-A1 entitled "Reducing Floating Gate to Floating Gate Coupling Effect" which are hereby incorporated by reference in the entirety for all purposes.

Flash memory is often used by some users to constantly store the same data pattern again and again repeatedly in some blocks of the flash memory. The result is that there will be some bits left to be erased but never programmed. Additionally, there will be also some bits always programmed and rarely erased. These persistent data patterns are problematic in that they may result in disturbs and other difficulties such as floating gate to floating gate effects, NAND string resistance effect, and reduced memory endurance and reliability, etc.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, retaining its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

EXAMPLES OF NON-VOLATILE MEMORY CELLS

The memory devices typically comprise one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing. There are many commercially successful non-volatile solid-state memory devices being used today. These memory devices may employ different types of memory cells, each type having one or more charge storage element.

FIGS. 1A-1E illustrate schematically different examples of non-volatile memory cells.

FIG. 1A illustrates schematically a non-volatile memory in the form of an EEPROM cell with a floating gate for storing charge. An electrically erasable and programmable read-only memory (EEPROM) has a similar structure to EPROM, but additionally provides a mechanism for loading and removing charge electrically from its floating gate upon application of proper voltages without the need for exposure to UV radiation. Examples of such cells and methods of manufacturing them are given in U.S. Pat. No. 5,595,924.

FIG. 1B illustrates schematically a flash EEPROM cell having both a select gate and a control or steering gate. The memory cell 10 has a "split-channel" 12 between source 14 and drain 16 diffusions. A cell is formed effectively with two transistors T1 and T2 in series. T1 serves as a memory transistor having a floating gate 20 and a control gate 30. The floating gate is capable of storing a selectable amount of charge. The amount of current that can flow through the T1's portion of the channel depends on the voltage on the control gate 30 and the amount of charge residing on the intervening floating gate 20. T2 serves as a select transistor having a select gate 40. When T2 is turned on by a voltage at the select gate 40, it allows the current in the T1's portion of the channel to pass between the source and drain. The select transistor provides a switch along the source-drain channel independent of the voltage at the control gate. One advantage is that it can be used to turn off those cells that are still conducting at zero control gate voltage due to their charge depletion (positive) at their floating gates. The other advantage is that it allows source side injection programming to be more easily implemented.

One simple embodiment of the split-channel memory cell is where the select gate and the control gate are connected to the same word line as indicated schematically by a dotted line shown in FIG. 1B. This is accomplished by having a charge storage element (floating gate) positioned over one portion of the channel and a control gate structure (which is part of a word line) positioned over the other channel portion as well as over the charge storage element. This effectively forms a cell with two transistors in series, one (the memory transistor) with a combination of the amount of charge on the charge storage element and the voltage on the word line controlling the amount of current that can flow through its portion of the channel, and the other (the select transistor) having the word line alone serving as its gate. Examples of such cells, their uses in memory systems and methods of manufacturing them are given in U.S. Pat. Nos. 5,070,032, 5,095,344, 5,315,541, 5,343,063, and 5,661,053.

A more refined embodiment of the split-channel cell shown in FIG. 1B is when the select gate and the control gate are independent and not connected by the dotted line between them. One implementation has the control gates of one column in an array of cells connected to a control (or steering) line perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the charge storage element to a desired level through an electric field (capacitive) coupling between the word line and the charge storage element. It is often difficult to perform both of these functions in an optimum manner with a single voltage. With the separate control of the control gate and the select gate, the word line need only perform function (1), while the added control line performs function (2). This capability allows for design of higher performance programming where the programming voltage is geared to the targeted data. The use of independent control (or steering) gates in a flash EEPROM array is described, for example, in U.S. Pat. Nos. 5,313,421 and 6,222,762.

FIG. 1C illustrates schematically another flash EEPROM cell having dual floating gates and independent select and control gates. The memory cell 10 is similar to that of FIG. 1B except it effectively has three transistors in series. In this type of cell, two storage elements (i.e., that of T1-left and T1-right) are included over its channel between source and drain diffusions with a select transistor T1 in between them. The memory transistors have floating gates 20 and 20', and control gates 30 and 30', respectively. The select transistor T2 is controlled by a select gate 40. At any one time, only one of the pair of memory transistors is accessed for read or write. When the storage unit T1-left is being accessed, both the T2 and T1-right are turned on to allow the current in the T1-left's portion of the channel to pass between the source and the drain. Similarly, when the storage unit T1-right is being accessed, T2 and T1-left are turned on. Erase is effected by having a portion of the select gate polysilicon in close proximity to the floating gate and applying a substantial positive voltage (e.g. 20V) to the select gate so that the electrons stored within the floating gate can tunnel to the select gate polysilicon.

FIG. 1D illustrates schematically a string of memory cells organized into an NAND cell. An NAND cell 50 consists of a series of memory transistors M1, M2, . . . Mn (n=4, 8, 16 or higher) daisy-chained by their sources and drains. A pair of select transistors S1, S2 controls the memory transistors chain's connection to the external via the NAND cell's source terminal 54 and drain terminal 56. In a memory array, when the source select transistor S1 is turned on, the source terminal is coupled to a source line. Similarly, when the drain select transistor S2 is turned on, the drain terminal of the NAND cell is coupled to a bit line of the memory array. Each memory transistor in the chain has a charge storage element to store a given amount of charge so as to represent an intended memory state. A control gate of each memory transistor provides control over read and write operations. A control gate of each of the select transistors S1, S2 provides control access to the NAND cell via its source terminal 54 and drain terminal 56 respectively.

When an addressed memory transistor within an NAND cell is read and verified during programming, its control gate is supplied with an appropriate voltage. At the same time, the rest of the non-addressed memory transistors in the NAND cell 50 are fully turned on by application of sufficient voltage on their control gates. In this way, a conductive path is effective created from the source of the individual memory transistor to the source terminal 54 of the NAND cell and likewise for the drain of the individual memory transistor to the drain terminal 56 of the cell. Memory devices with such NAND cell structures are described in U.S. Pat. Nos. 5,570,315, 5,903, 495, 6,046,935.

FIG. 1E illustrates schematically a non-volatile memory with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, Nov. 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Memory Array

A memory device typically comprises of a two-dimensional array of memory cells arranged in rows and columns and addressable by word lines and bit lines. The array can be formed according to an NOR type or an NAND type architecture.

NOR Array

FIG. 2 illustrates an example of an NOR array of memory cells. Memory devices with an NOR type architecture have been implemented with cells of the type illustrated in FIG. 1B or 1C. Each row of memory cells are connected by their sources and drains in a daisy-chain manner. This design is sometimes referred to as a virtual ground design. Each memory cell 10 has a source 14, a drain 16, a control gate 30 and a select gate 40. The cells in a row have their select gates connected to word line 42. The cells in a column have their sources and drains respectively connected to selected bit lines 34 and 36. In some embodiments where the memory cells have their control gate and select gate controlled independently, a steering line 36 also connects the control gates of the cells in a column.

Many flash EEPROM devices are implemented with memory cells where each is formed with its control gate and select gate connected together. In this case, there is no need for steering lines and a word line simply connects all the control gates and select gates of cells along each row. Examples of these designs are disclosed in U.S. Pat. Nos. 5,172,338 and 5,418,752. In these designs, the word line essentially performed two functions: row selection and supplying control gate voltage to all cells in the row for reading or programming.

NAND Array

FIG. 3 illustrates an example of an NAND array of memory cells, such as that shown in FIG. 1D. Along each column of NAND cells, a bit line is coupled to the drain terminal 56 of each NAND cell. Along each row of NAND cells, a source line may connect all their source terminals 54. Also the control gates of the NAND cells along a row are connected to a series of corresponding word lines. An entire row of NAND cells can be addressed by turning on the pair of select transistors (see FIG. 1D) with appropriate voltages on their control gates via the connected word lines. When a memory transistor within the chain of a NAND cell is being read, the remaining memory transistors in the chain are turned on hard via their associated word lines so that the current flowing through the chain is essentially dependent upon the level of charge stored in the cell being read. An example of an NAND architecture array and its operation as part of a memory system is found in U.S. Pat. Nos. 5,570,315, 5,774,397 and 6,046,935.

Block Erase

Programming of charge storage memory devices can only result in adding more charge to its charge storage elements. Therefore, prior to a program operation, existing charge in a charge storage element must be removed (or erased). Erase circuits (not shown) are provided to erase one or more blocks of memory cells. A non-volatile memory such as EEPROM is referred to as a "Flash" EEPROM when an entire array of cells, or significant groups of cells of the array, is electrically erased together (i.e., in a flash). Once erased, the group of cells can then be reprogrammed. The group of cells erasable together may consist one or more addressable erase unit. The erase unit or block typically stores one or more pages of data, the page being the unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in with it is stored.

Read/Write Circuits

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current $I_{REF}$) If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

FIG. 4 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Six memory states may be demarcated by partitioning the threshold window into five regions in interval of 0.5V each. For example, if a reference current, $I_{REF}$ of 2 μA is used as shown, then the cell programmed with Q1 may be considered to be in a memory state "1" since its curve intersects with $I_{REF}$ in the region of the threshold window demarcated by $V_{CG}$=0.5V and 1.0V. Similarly, Q4 is in a memory state "5".

As can be seen from the description above, the more states a memory cell is made to store, the more finely divided is its threshold window. This will require higher precision in programming and reading operations in order to be able to achieve the required resolution.

U.S. Pat. No. 4,357,685 discloses a method of programming a 2-state EPROM in which when a cell is programmed to a given state, it is subject to successive programming voltage pulses, each time adding incremental charge to the floating gate. In between pulses, the cell is read back or verified to determine its source-drain current relative to the breakpoint level. Programming stops when the current state has been verified to reach the desired state. The programming pulse train used may have increasing period or amplitude.

Prior art programming circuits simply apply programming pulses to step through the threshold window from the erased or ground state until the target state is reached. Practically, to allow for adequate resolution, each partitioned or demarcated region would require at least about five programming steps to transverse. The performance is acceptable for 2-state memory cells. However, for multi-state cells, the number of steps required increases with the number of partitions and therefore, the programming precision or resolution must be increased. For example, a 16-state cell may require on average at least 40 programming pulses to program to a target state.

FIG. 5 illustrates schematically a memory device with a typical arrangement of a memory array 100 accessible by read/write circuits 170 via row decoder 130 and column decoder 160. As described in connection with FIG. 2 and FIG. 3, a memory transistor of a memory cell in the memory array 100 is addressable via a set of selected word line(s) and bit line(s). The row decoder 130 selects one or more word lines and the column decoder 160 selects one or more bit lines in order to apply appropriate voltages to the respective gates of the addressed memory transistor. Read/write circuits 170 are provided to read or write (program) the memory states of addressed memory transistors. The read/write circuits 170 comprise a number of read/write modules connectable via bit lines to memory elements in the array.

FIG. 6A is a schematic block diagram of an individual read/write module 190. Essentially, during read or verify, a sense amplifier determines the current flowing through the drain of an addressed memory transistor connected via a selected bit line. The current depends on the charge stored in the memory transistor and its control gate voltage. For example, in a multi-state EEPROM cell, its floating gate can be charged to one of several different levels. For a 4-level cell, it may be used to store two bits of data. The level detected by the sense amplifier is converted by a level-to-bits conversion logic to a set of data bits to be stored in a data latch.

Factors Affecting Read/Write Performance and Accuracy

In order to improve read and program performance, multiple charge storage elements or memory transistors in an array are read or programmed in parallel. Thus, a logical "page" of memory elements are read or programmed together. In existing memory architectures, a row typically contains several interleaved pages. All memory elements of a page will be read or programmed together. The column decoder will selectively connect each one of the interleaved pages to a corresponding number of read/write modules. For example, in one implementation, the memory array is designed to have a page size of 532 bytes (512 bytes plus 20 bytes of overheads.) If each column contains a drain bit line and there are two interleaved pages per row, this amounts to 8512 columns with each page being associated with 4256 columns. There will be 4256 sense modules connectable to read or write in parallel either all the even bit lines or the odd bit lines. In this way, a page of 4256 bits (i.e., 532 bytes) of data in parallel are read from or programmed into the page of memory elements. The read/write modules forming the read/write circuits 170 can be arranged into various architectures.

Referring to FIG. 5, the read/write circuits 170 is organized into banks of read/write stacks 180. Each read/write stack 180 is a stack of read/write modules 190. In a memory array, the column spacing is determined by the size of the one or two transistors that occupy it. However, as can be seen from FIG. 6A, the circuitry of a read/write module will likely be implemented with many more transistors and circuit elements and therefore will occupy a space over many columns. In order to service more than one column among the occupied columns, multiple modules are stacked up on top of each other.

FIG. 6B shows the read/write stack of FIG. 5 implemented conventionally by a stack of read/write modules 190. For example, a read/write module may extend over sixteen columns, then a read/write stack 180 with a stack of eight read/write modules can be used to service eight columns in parallel. The read/write stack can be coupled via a column decoder to either the eight odd (1, 3, 5, 7, 9, 11, 13, 15) columns or the eight even (2, 4, 6, 8, 10, 12, 14, 16) columns among the bank.

As mentioned before, conventional memory devices improve read/write operations by operating in a massively parallel manner on all even or all odd bit lines at a time. This architecture of a row consisting of two interleaved pages will help to alleviate the problem of fitting the block of read/write circuits. It is also dictated by consideration of controlling bit-line to bit-line capacitive coupling. A block decoder is used to multiplex the set of read/write modules to either the even page or the odd page. In this way, whenever one set bit lines are being read or programmed, the interleaving set can be grounded to minimize immediate neighbor coupling.

However, the interleaving page architecture is disadvantageous in at least three respects. First, it requires additional multiplexing circuitry. Secondly, it is slow in performance. To finish read or program of memory cells connected by a word line or in a row, two read or two program operations are required. Thirdly, it is also not optimum in addressing other disturb effects such as field coupling between neighboring charge storage elements at the floating gate level when the two neighbors are programmed at different times, such as separately in odd and even pages.

The problem of neighboring field coupling becomes more pronounced with ever closer spacing between memory transistors. In a memory transistor, a charge storage element is sandwiched between a channel region and a control gate. The current that flows in the channel region is a function of the resultant electric field contributed by the field at the control gate and the charge storage element. With ever increasing density, memory transistors are formed closer and closer together. The field from neighboring charge elements then becomes significant contributor to the resultant field of an affected cell. The neighboring field depends on the charge programmed into the charge storage elements of the neighbors. This perturbing field is dynamic in nature as it changes with the programmed states of the neighbors. Thus, an affected cell may read differently at different time depending on the changing states of the neighbors.

The conventional architecture of interleaving page exacerbates the error caused by neighboring floating gate coupling. Since the even page and the odd page are programmed and read independently of each other, a page may be programmed under one set of condition but read back under an entirely different set of condition, depending on what has happened to the intervening page in the meantime. The read errors will become more severe with increasing density, requiring a more accurate read operation and coarser partitioning of the threshold window for multi-state implementation. Performance will suffer and the potential capacity in a multi-state implementation is limited.

United States Patent Publication No. US-2004-0060031-A1 discloses a high performance yet compact non-volatile memory device having a large block of read/write circuits to read and write a corresponding block of memory cells in parallel. In particular, the memory device has an architecture that reduces redundancy in the block of read/write circuits to a minimum. Significant saving in space as well as power is accomplished by redistributing the block of read/write modules into a block read/write module core portions that operate in parallel while interacting with a substantially smaller sets of common portions in a time-multiplexing manner. In particular, data processing among read/write circuits between a plurality of sense amplifiers and data latches is performed by a shared processor.

Therefore there is a general need for high performance and high capacity non-volatile memory. In particular, there is a need for a compact non-volatile memory with enhanced read and program performance having an improved processor that is compact and efficient, yet highly versatile for processing data among the read/writing circuits.

SUMMARY OF THE INVENTION

According to one aspect of the invention, the data in each memory page is randomized such that when data from several pages are lined up problematic data patterns are avoided during programming.

In one preferred embodiment, a simple way of scrambling the data on a page is to write the data on an independent or different starting address for each different page. A corresponding page of data is written to each page of memory cells at a different starting location for each page. When the data is filled to the end of the page, it continues by wrapping around from the first address of the page until just before the starting location.

In another preferred embodiment, a sequence of starting physical column addresses, one for each page, is provided by a pseudo-random generator.

According to another aspect of the invention, the data bits in the page are randomized such that on average the page contains an equal mix of cells with erased and programmed states. In this way, the source line bias or loading does not vary substantially and can be allowed for with appropriate adjustment during the sensing operation.

This is accomplished by randomizing the individual bits within a page. Preferably, a sequence of pseudo random bits, each specifying a certain polarity is employed to encode bits within the page. In one embodiment, there is a polarity bit for each data bit in the page. In another embodiment, there is a polarity bit for each byte of data in the page. In this embodiment, if the polarity bit specifies a flipping of the bits, then all bits within the data byte will get flipped.

According to another aspect of the invention, randomization within a page is combined with randomization form page to page. In particular, given the limited resource of the on-chip circuitry, randomization within a page is preferably accomplished by each page having an independent starting position and randomization from page to page is preferably accomplished by each page having an independent encoding polarity.

In another embodiment, the randomization within a page implemented by each page having an independent starting position is also augmented by each set of data bits within a page having an independent encoding polarity.

The various randomization methodologies and embodiments are memory chip (EEPROM) implemented. This is to say that they take place within the memory chip itself rather than with a memory controller that communicates with the chip. This differs from a different technique of addressing the issue known as wear leveling that is often implemented on a system level and utilizes the controller to change how data is stored within the memory chip.

The present invention will reduce or eliminate the specific data patterns which can cause program disturbs or user read disturbs, as well as reducing NAND string resistance effect, and increasing memory endurance and reliability. It will also reduce the problem of floating gate to floating gate coupling.

BRIEF DESCRIPTION OF THE FIGURES

FIG. 13 is a simplified version of FIG. 10 that shows some specific elements that are relevant to the present discussion in a two-bit embodiment of the present invention FIG. 14 indicates the latch assignment for the same elements as FIG. 13 for upper page program where the lower page data is read in.

FIG. 23A is an illustration of encoding scheme determination as a function of a command clock signal.

FIG. 23B is a clock signal of a command.

FIG. 23C illustrates an embodiment of control circuitry for data encoding determination and inversion.

FIG. 23D illustrates a page of user data with the polarity bit stored therein.

FIG. 23E illustrates an embodiment of control circuitry for reverting the encoding of potentially inverted data for read operations.

FIG. 27 is a table illustrating an example of different pages having different starting locations for writing data.

DESCRIPTION OF THE PREFERRED EMBODIMENTS

FIG. 7A to FIG. 20 illustrate preferred memory systems in which the present invention is implemented.

Figure 7A:
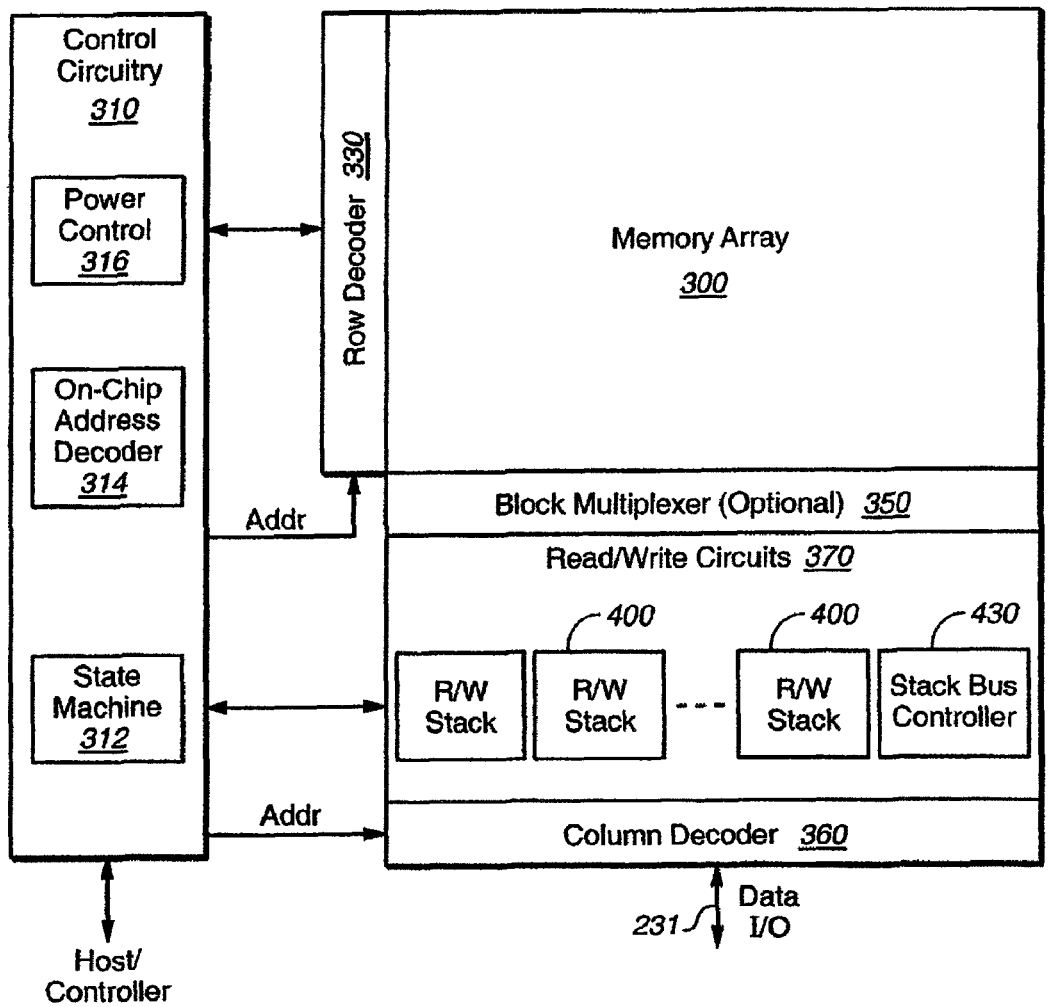
FIG. 7A illustrates schematically a compact memory device having a bank of partitioned read/write stacks, in which the improved processor of the present invention is implemented.

FIG. 7A illustrates schematically a compact memory device having a bank of partitioned read/write stacks, in which the improved processor of the present invention is implemented. The memory device includes a two-dimensional array of memory cells 300, control circuitry 310, and read/write circuits 370. The memory array 300 is addressable by word lines via a row decoder 330 and by bit lines via a column decoder 360. The read/write circuits 370 is implemented as a bank of partitioned read/write stacks 400 and allows a block (also referred to as a "page") of memory cells to be read or programmed in parallel. In a preferred embodiment, a page is constituted from a contiguous row of memory cells. In another embodiment, where a row of memory cells are partitioned into multiple blocks or pages, a block multiplexer 350 is provided to multiplex the read/write circuits 370 to the individual blocks.

The control circuitry 310 cooperates with the read/write circuits 370 to perform memory operations on the memory array 300. The control circuitry 310 includes a state machine 312, an on-chip address decoder 314 and a power control module 316. The state machine 312 provides chip level control of memory operations. The on-chip address decoder 314 provides an address interface between that used by the host or a memory controller to the hardware address used by the decoders 330 and 370. The power control module 316 controls the power and voltages supplied to the word lines and bit lines during memory operations.

Figure 7B:
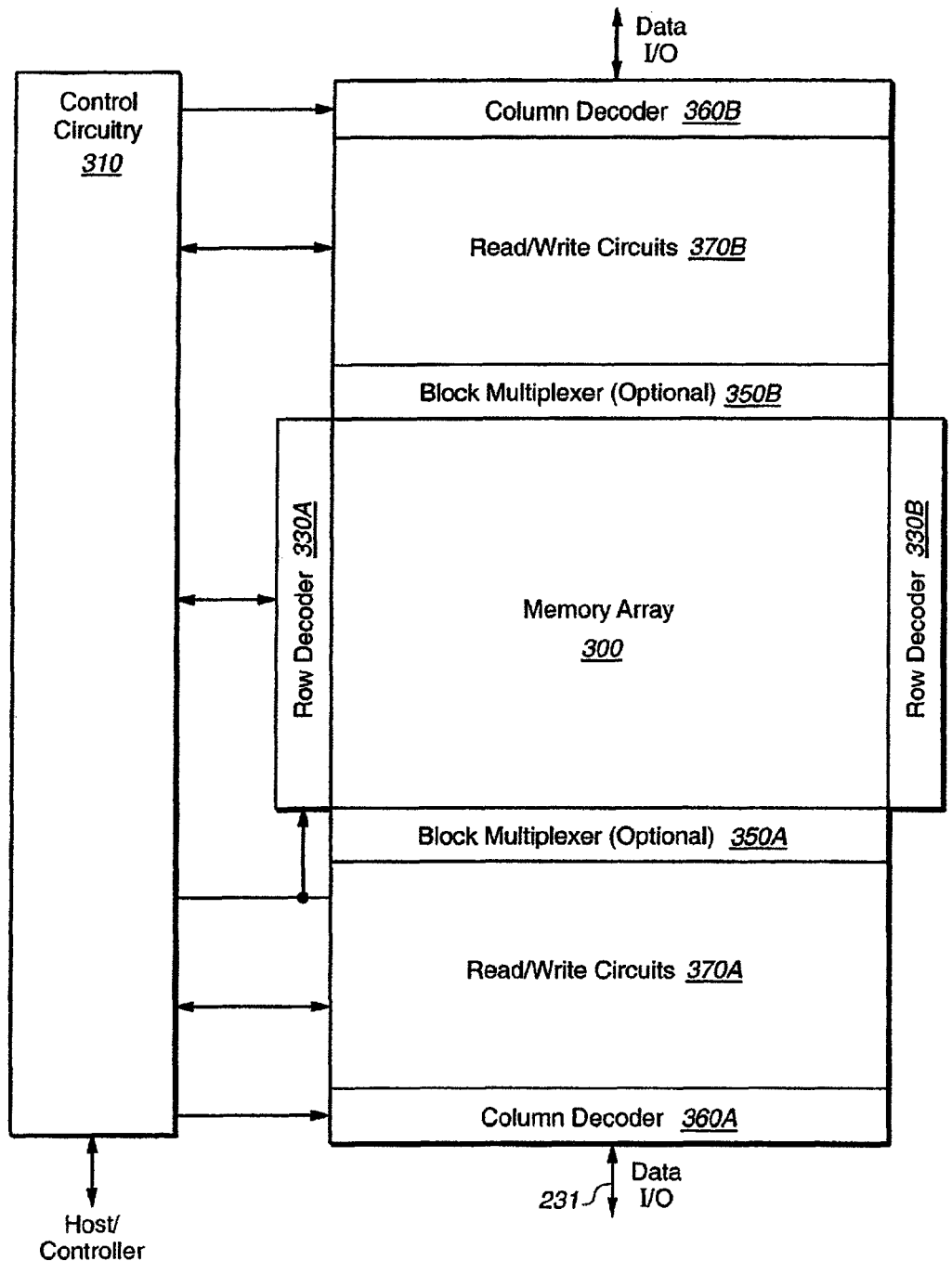
FIG. 7B illustrates a preferred arrangement of the compact memory device shown in FIG. 7A.

FIG. 7B illustrates a preferred arrangement of the compact memory device shown in FIG. 7A. Access to the memory array 300 by the various peripheral circuits is implemented in a symmetric fashion, on opposite sides of the array so that access lines and circuitry on each side are reduced in half. Thus, the row decoder is split into row decoders 330A and 330B and the column decoder into column decoders 360A and 360B. In the embodiment where a row of memory cells are partitioned into multiple blocks, the block multiplexer 350 is split into block multiplexers 350A and 350B. Similarly, the read/write circuits are split into read/write circuits 370A connecting to bit lines from the bottom and read/write circuits 370B connecting to bit lines from the top of the array 300. In this way, the density of the read/write modules, and therefore that of the partitioned read/write stacks 400, is essentially reduced by one half.

Figure 8:
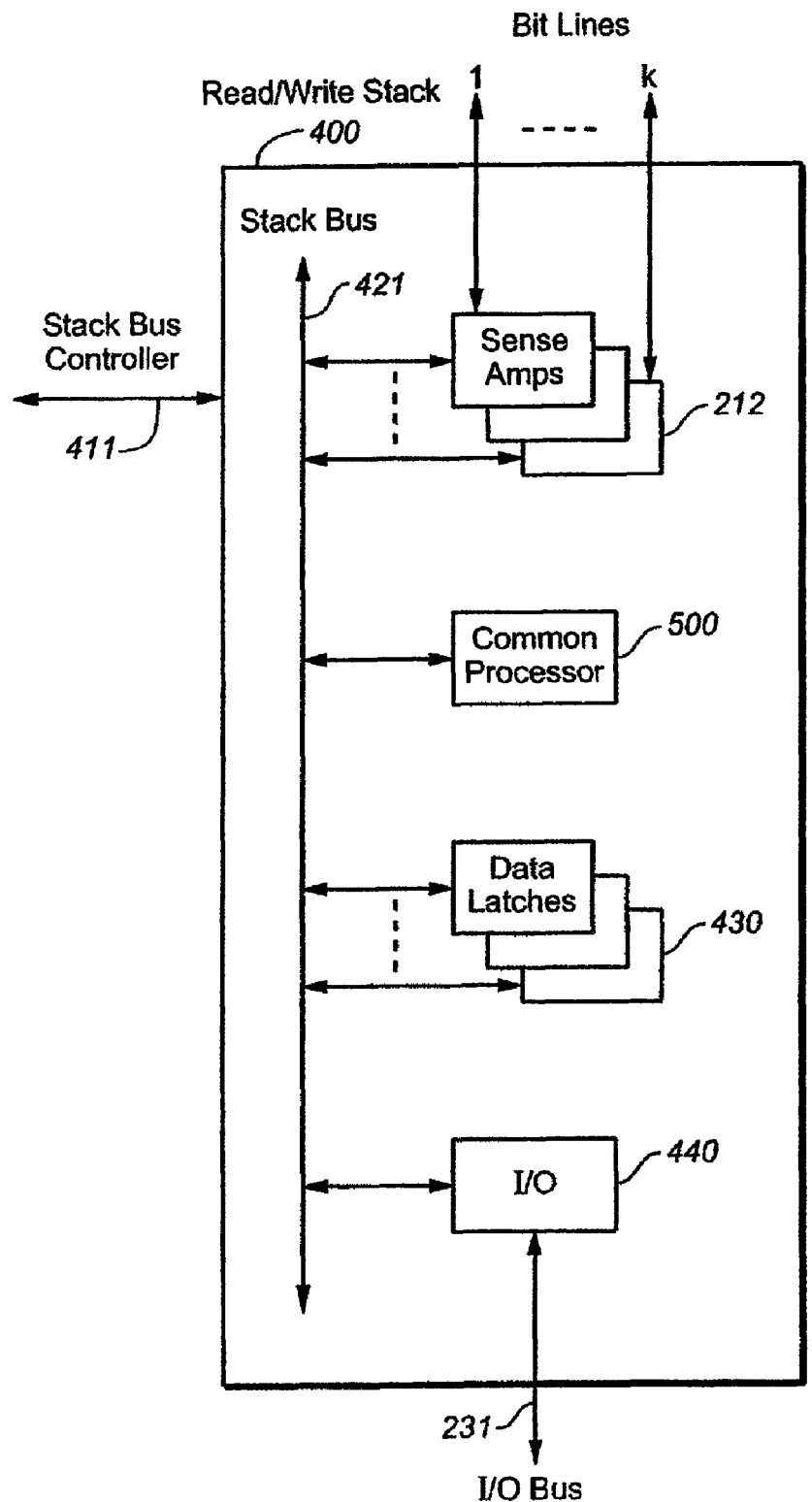
FIG. 8 illustrates schematically a general arrangement of the basic components in a read/write stack shown in FIG. 7A.

FIG. 8 illustrates schematically a general arrangement of the basic components in a read/write stack shown in FIG. 7A. According to a general architecture of the invention, the read/write stack 400 comprises a stack of sense amplifiers 212 for sensing k bit lines, an I/O module 440 for input or output of data via an I/O bus 231, a stack of data latches 430 for storing input or output data, a common processor 500 to process and store data among the read/write stack 400, and a stack bus 421 for communication among the stack components. A stack bus controller among the read/write circuits 370 provides control and timing signals via lines 411 for controlling the various components among the read/write stacks.

Figure 9:
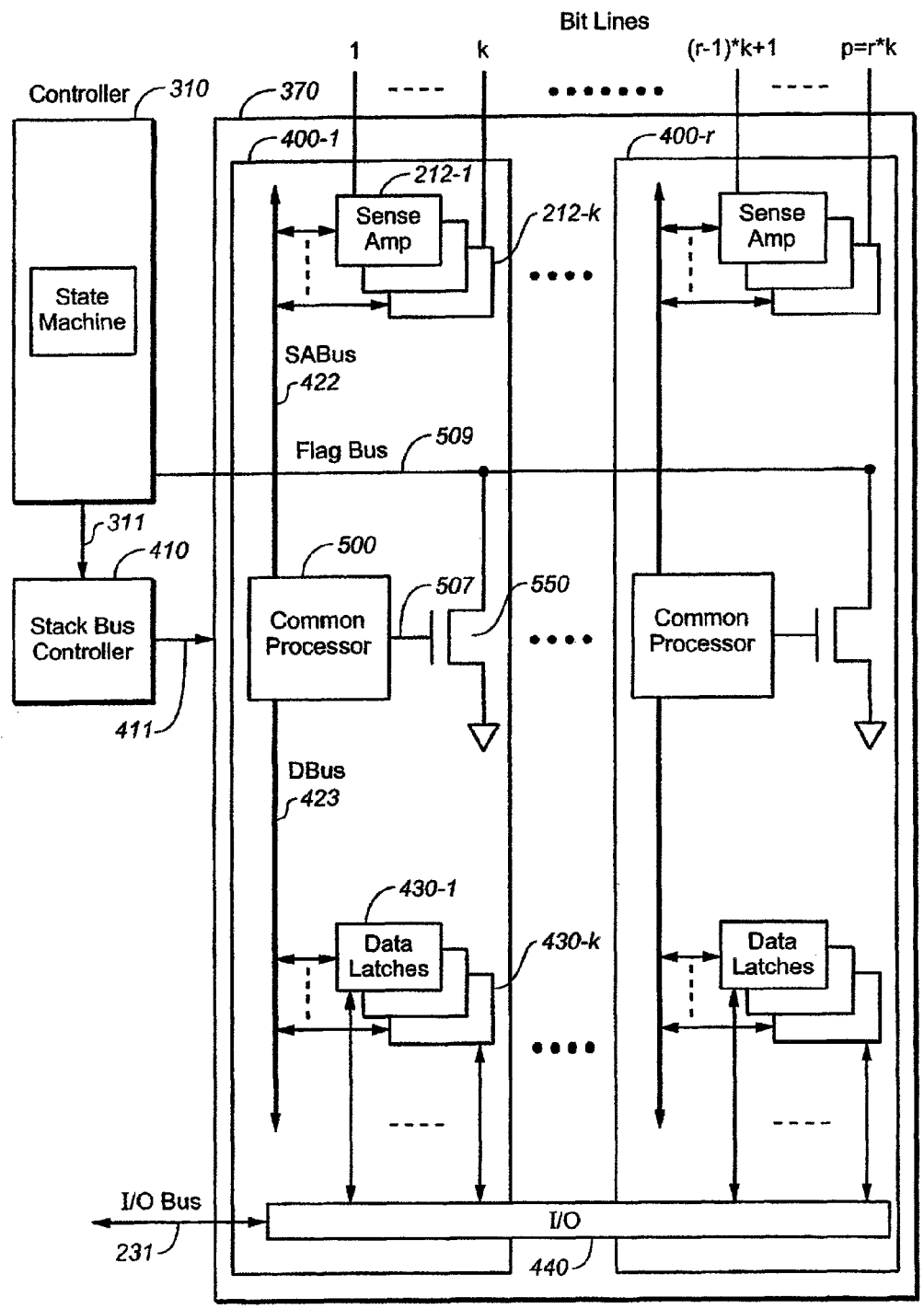
FIG. 9 illustrates one preferred arrangement of the read/write stacks among the read/write circuits shown in FIGS. 7A and 7B.

FIG. 9 illustrates one preferred arrangement of the read/write stacks among the read/write circuits shown in FIGS. 7A and 7B. Each read/write stack 400 operates on a group of k bit lines in parallel. If a page has p=r*k bit lines, there will be r read/write stacks, 400-1, . . . , 400-r.

The entire bank of partitioned read/write stacks 400 operating in parallel allows a block (or page) of p cells along a row to be read or programmed in parallel. Thus, there will be p read/write modules for the entire row of cells. As each stack is serving k memory cells, the total number of read/write stacks in the bank is therefore given by r=p/k. For example, if r is the number of stacks in the bank, then p=r*k. One example memory array may have p=512 bytes (512×8 bits), k=8, and therefore r=512. In the preferred embodiment, the block is a run of the entire row of cells. In another embodiment, the block is a subset of cells in the row. For example, the subset of cells could be one half of the entire row or one quarter of the entire row. The subset of cells could be a run of contiguous cells or one every other cell, or one every predetermined number of cells.

Each read/write stack, such as 400-1, essentially contains a stack of sense amplifiers 212-1 to 212-k servicing a segment of k memory cells in parallel. A preferred sense amplifier is disclosed in United States Patent Publication No. 2004-0109357-A1, the entire disclosure of which is hereby incorporated herein by reference.

The stack bus controller 410 provides control and timing signals to the read/write circuit 370 via lines 411. The stack bus controller is itself dependent on the memory controller 310 via lines 311. Communication among each read/write stack 400 is effected by an interconnecting stack bus 431 and controlled by the stack bus controller 410. Control lines 411 provide control and clock signals from the stack bus controller 410 to the components of the read/write stacks 400-1.

In the preferred arrangement, the stack bus is partitioned into a SABus 422 for communication between the common processor 500 and the stack of sense amplifiers 212, and a DBus 423 for communication between the processor and the stack of data latches 430.

The stack of data latches 430 comprises of data latches 430-1 to 430-k, one for each memory cell associated with the stack. The I/O module 440 enables the data latches to exchange data with the external via an I/O bus 231.

The common processor also includes an output 507 for output of a status signal indicating a status of the memory operation, such as an error condition. The status signal is used to drive the gate of an n-transistor 550 that is tied to a FLAG BUS 509 in a Wired-Or configuration. The FLAG BUS is preferably precharged by the controller 310 and will be pulled down when a status signal is asserted by any of the read/write stacks.

Figure 10:
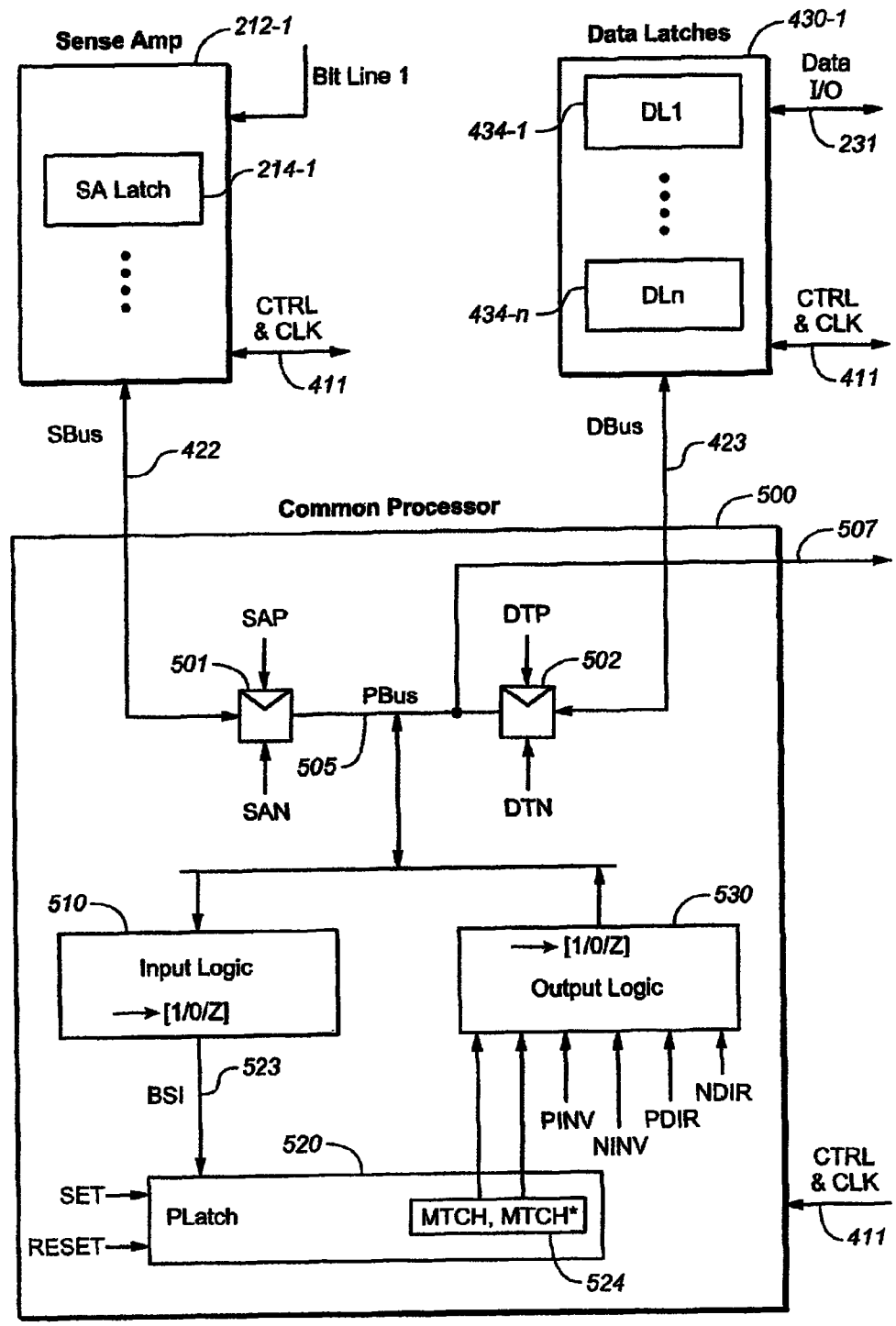
FIG. 10 illustrates an improved embodiment of the common processor shown in FIG. 9.

FIG. 10 illustrates an improved embodiment of the common processor shown in FIG. 9. The common processor 500 comprises a processor bus, PBUS 505 for communication with external circuits, an input logic 510, a processor latch PLatch 520 and an output logic 530.

The input logic 510 receives data from the PBUS and outputs to a BSI node as a transformed data in one of logical states "1", "0", or "Z" (float) depending on the control signals from the stack bus controller 410 via signal lines 411. A Set/Reset latch, PLatch 520 then latches BSI, resulting in a pair of complementary output signals as MTCH and MTCH*.

The output logic 530 receives the MTCH and MTCH* signals and outputs on the PBUS 505 a transformed data in one of logical states "1", "0", or "Z" (float) depending on the control signals from the stack bus controller 410 via signal lines 411.

At any one time the common processor 500 processes the data related to a given memory cell. For example, FIG. 10 illustrates the case for the memory cell coupled to bit line 1. The corresponding sense amplifier 212-1 comprises a node where the sense amplifier data appears. In the preferred embodiment, the node assumes the form of a SA Latch, 214-1 that stores data. Similarly, the corresponding set of data latches 430-1 stores input or output data associated with the memory cell coupled to bit line 1. In the preferred embodiment, the set of data latches 430-1 comprises sufficient data latches, 434-1, . . . , 434-n for storing n-bits of data.

The PBUS 505 of the common processor 500 has access to the SA latch 214-1 via the SBUS 422 when a transfer gate 501 is enabled by a pair of complementary signals SAP and SAN. Similarly, the PBUS 505 has access to the set of data latches 430-1 via the DBUS 423 when a transfer gate 502 is enabled by a pair of complementary signals DTP and DTN. The signals SAP, SAN, DTP and DTN are illustrated explicitly as part of the control signals from the stack bus controller 410.

Figures 11A, 11B:
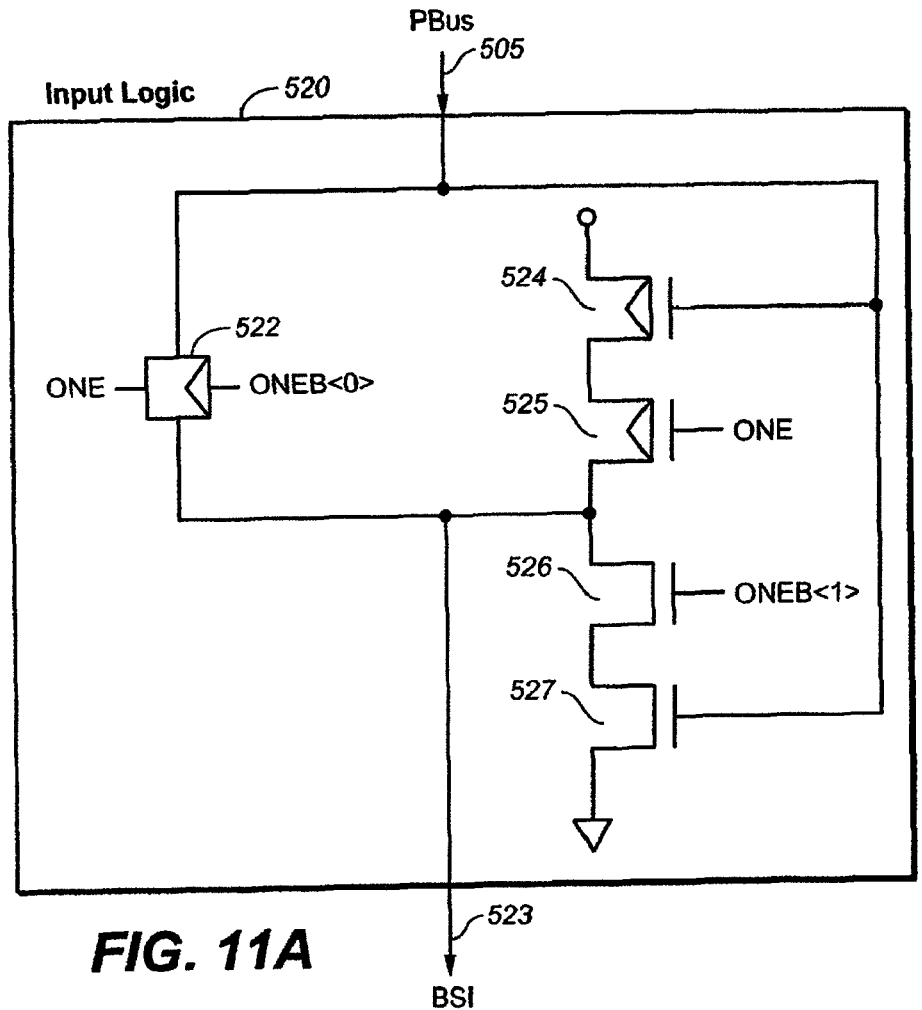
FIG. 11A illustrates a preferred embodiment of the input logic of the common processor shown in FIG. 10.
FIG. 11B illustrates the truth table of the input logic of FIG. 11A.

FIG. 11A illustrates a preferred embodiment of the input logic of the common processor shown in FIG. 10. The input logic 520 receives the data on the PBUS 505 and depending on the control signals, either has the output BSI being the same, or inverted, or floated. The output BSI node is essentially affected by either the output of a transfer gate 522 or a pull-up circuit comprising p-transistors 524 and 525 in series to Vdd, or a pull-down circuit comprising n-transistors 526 and 527 in series to ground. The pull-up circuit has the gates to the p-transistor 524 and 525 respectively controlled by the signals PBUS and ONE. The pull-down circuit has the gates to the n-transistors 526 and 527 respectively controlled by the signals ONEB<1> and PBUS.

FIG. 11B illustrates the truth table of the input logic of FIG. 11A. The logic is controlled by PBUS and the control signals ONE, ONEB<0>, ONEB<1> which are part of the control signals from the stack bus controller 410. Essentially, three transfer modes, PASSTHROUGH, INVERTED, and FLOATED, are supported.

In the case of the PASSTHROUGH mode where BSI is the same as the input data, the signals ONE is at a logical "1", ONEB<0> at "0" and ONEB<1> at "0". This will disable the pull-up or pull-down but enable the transfer gate 522 to pass the data on the PBUS 505 to the output 523. In the case of the INVERTED mode where BSI is the invert of the input data, the signals ONE is at "0", ONEB<0> at "1" and ONE<1> at "1". This will disable the transfer gate 522. Also, when PBUS is at "0", the pull-down circuit will be disabled while the pull-up circuit is enabled, resulting in BSI being at "1". Similarly, when PBUS is at "1", the pull-up circuit is disabled while the pull-down circuit is enabled, resulting in BSI being at "0". Finally, in the case of the FLOATED mode, the output BSI can be floated by having the signals ONE at "1", ONEB<0> at "1" and ONEB<1> at "0". The FLOATED mode is listed for completeness although in practice, it is not used.

Figures 12A, 12B:
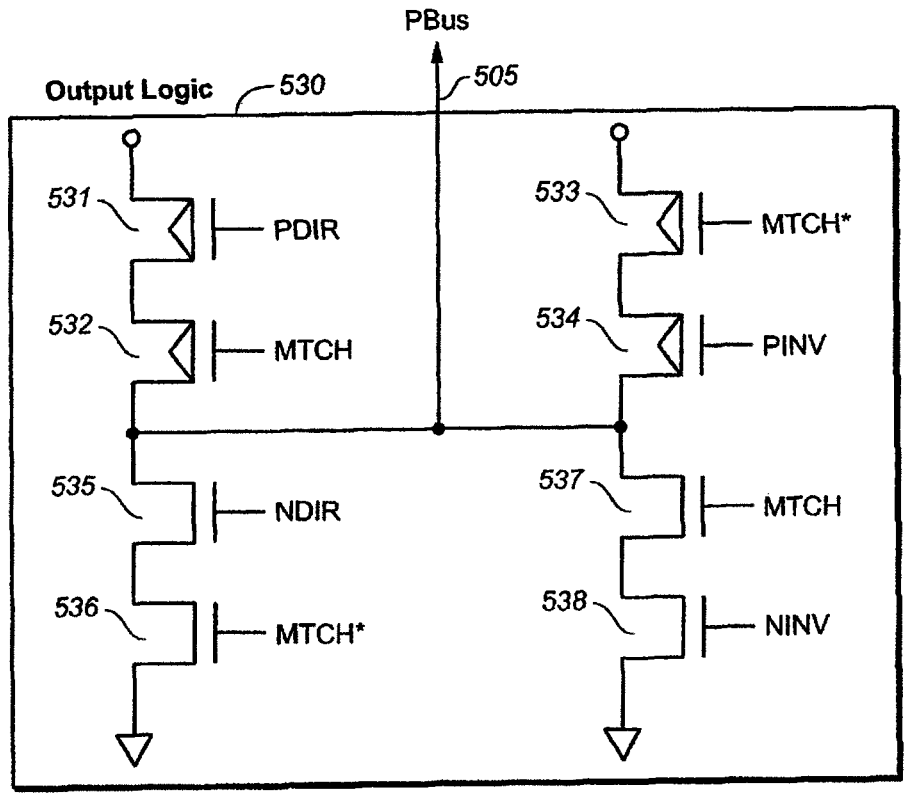
FIG. 12A illustrates a preferred embodiment of the output logic of the common processor shown in FIG. 10.
FIG. 12B illustrates the truth table of the output logic of FIG. 12A.

FIG. 12A illustrates a preferred embodiment of the output logic of the common processor shown in FIG. 10. The signal at the BSI node from the input logic 520 is latched in the processor latch, PLatch 520. The output logic 530 receives the data MTCH and MTCH* from the output of PLatch 520 and depending on the control signals, outputs on the PBUS as either in a PASSTHROUGH, INVERTED OR FLOATED mode. In other words, the four branches act as drivers for the PBUS 505, actively pulling it either to a HIGH, LOW or FLOATED state. This is accomplished by four branch circuits, namely two pull-up and two pull-down circuits for the PBUS 505. A first pull-up circuit comprises p-transistors 531 and 532 in series to Vdd, and is able to pull up the PBUS when MTCH is at "0". A second pull-up circuit comprises p-transistors 533 and 534 in series to ground and is able to pull up the PBUS when MTCH is at "1". Similarly, a first pull-down circuit comprises n-transistors 535 and 536 in series to Vdd, and is able to pull down the PBUS when MTCH is at "0". A second pull-up circuit comprises n-transistors 537 and 538 in series to ground and is able to pull up the PBUS when MTCH is at "1".

One feature of the invention is to constitute the pull-up circuits with PMOS transistors and the pull-down circuits with NMOS transistors. Since the pull by the NMOS is much stronger than that of the PMOS, the pull-down will always overcome the pull-up in any contentions. In other words, the node or bus can always default to a pull-up or "1" state, and if desired, can always be flipped to a "0" state by a pull-down.

FIG. 12B illustrates the truth table of the output logic of FIG. 12A. The logic is controlled by MTCH, MTCH* latched from the input logic and the control signals PDIR, PINV, NDIR, NINV, which are part of the control signals from the stack bus controller 410. Four operation modes, PASSTHROUGH, INVERTED, FLOATED, and PRECHARGE are supported.

In the FLOATED mode, all four branches are disabled. This is accomplished by having the signals PINV=1, NINV=0, PDIR=1, NDIR=0, which are also the default values. In the PASSTHROUGH mode, when MTCH=0, it will require PBUS=0. This is accomplished by only enabling the pull-down branch with n-transistors 535 and 536, with all control signals at their default values except for NDIR=1. When MTCH=1, it will require PBUS=1. This is accomplished by only enabling the pull-up branch with p-transistors 533 and 534, with all control signals at their default values except for PINV=0. In the INVERTED mode, when MTCH=0, it will require PBUS=1. This is accomplished by only enabling the pull-up branch with p-transistors 531 and 532, with all control signals at their default values except for PDIR=0. When MTCH=1, it will require PBUS=0. This is accomplished by only enabling the pull-down branch with n-transistors 537 and 538, with all control signals at their default values except for NINV=1. In the PRECHARGE mode, the control signals settings of PDIR=0 and PINV=0 will either enable the pull-up branch with p-transistors 531 and 531 when MTCH=1 or the pull-up branch with p-transistors 533 and 534 when MTCH=0.

Common processor operations are developed more fully in U.S. patent application publication number US-2006-0140007 A1, which is hereby incorporated in its entirety by this reference.

Use of Data Latches in Cache Operations

A number of aspects of the present invention make use of the data latches of the read/write stacks described above in FIG. 10 for cache operations that will data in and out while the internal memory is doing other operations such as read, write, or erase. In the above-described architectures, data latches are shared by a number of physical pages. For example, as on the read/write stacks of the bit lines, shared by all of the word lines, so while one operation is going on, if any of these latches are free, they can cache data for future operations in the same or another word line, saving transfer time as this can be hidden behind another operation. This can improve performance by increasing the amount of pipelining of different operations or phases of operations. In one example, in a cache program operation, while programming one page of data another page of data can be loaded in, saving on transfer time. For another example, in one exemplary embodiment, a read operation on one word line is inserted into a write operation on another word line, allowing the data from the read to be transferred out of the memory while the data write continues on.

Note that this allows data from another page in the same block, but on a different word line, to be toggled out (to, for example, do an ECC operation) while the write or other operation is going on for the first page of data. This interphase pipelining of operations allows the time needed for the data transfer to be hidden behind the operation on the first page of data. More generally, this allows a portion of one operation to be inserted between phases of another, typically longer, operation. Another example would be to insert a sensing operation between phases of, say, an erase operation, such as before an erase pulse or before a soft programming phase used as the later part of the erase.

To make the relative times needed for some of the operations discussed, a set of exemplary time values for the system described above can be take as:

Data write: ~700 µs (lower page~600 µs, upper page 800 µs)

Binary data write: ~200 µs

Erase: ~2,500 µs

Read: ~20-40 µs

Read and toggle out data: 2 KB data, ~80 µs; 4 KB~160 µs; 8 KB~320 µs

These values can be used for reference to give an idea of the relative times involved for the timing diagrams below. If have a long operation with different phases, a primary aspect will interpose in a quicker operation using the shared latches of the read/write stacks if latches available. For example, a read can be inserted into a program or erase operation, or a binary program can be inserted into an erase. The primary exemplary embodiments will toggle data in and/or out for one page during a program operation for another page that shares the same read write stacks, where, for example, a read of the data to be toggled out and modified is inserted into the verify phase of the data write.

The availability of open data latches can arise in a number of ways. Generally, for a memory storing n bits per cell, n such data latches will be needed for each bit line; however, not all of these latches are needed at all times. For example, in a two-bit per cell memory storing data in an upper page/lower page format, two data latches will be needed while programming the lower page. More generally, for memories storing multiple pages, all of the latches will be needed only when programming the highest page. This leaves the other latches available for cache operations. Further, even while writing the highest page, as the various states are removed from the verify phase of the write operation, latches will free up. Specifically, once only the highest state remains to be verified, only a single latch is needed for verification purposes and the others may be used for cache operations.

The following discussion will be based on a four state memory storing two-bits per cell and having two latches for data on each bit line and one additional latch for quick pass write, as described in U.S. patent application entitled "Use of Data Latches in Multi-Phase Programming of Non-Volatile Memories" filed concurrently with the present application that was incorporated above. The operations of writing the lower page, or erasing, or doing a post erase soft program are basically a binary operation and have one of the data latches free, which can use it to cache data. Similarly, where doing an upper page or full sequence write, once all but the highest level has verified, only a single state needs to verify and the memory can free up a latch that can be used to cache data. An example of how this can be used is that when programming one page, such as in a copy operation, a read of another page that shares the same set of data latches, such as another word line on the same set of bit lines, can be slipped in during the verify phase of the write. The address can then be switched to the page being written, allowing the write process to pick up where it left off without having to restart. While the write continues, the data cached during the interpolated read can be toggled out, checked or modified and transferred back to be present for writing back in once the earlier write operation completes. This sort cache operation allows the toggling out and modification of the second page of data to be hidden behind the programming of the first page.

Figure 13:
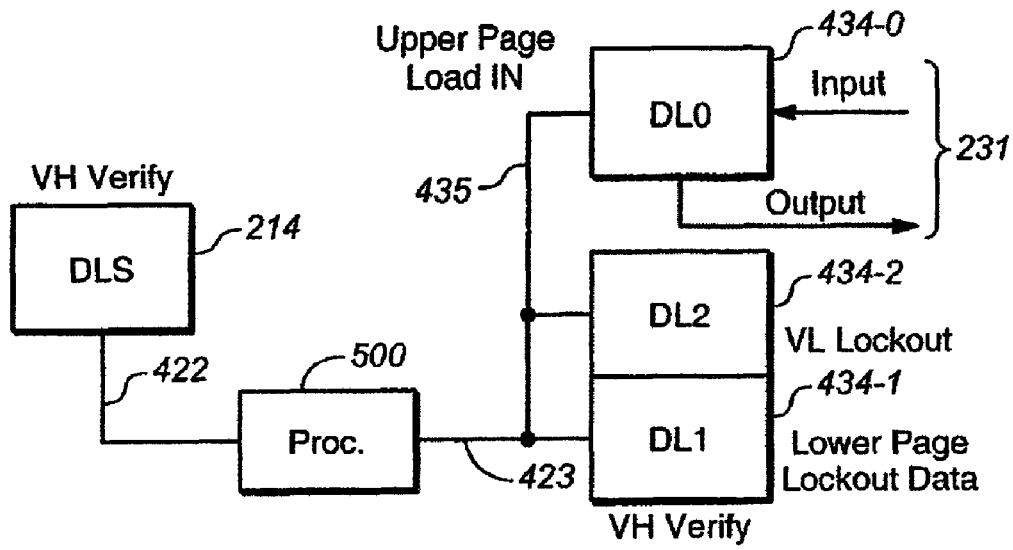

As a first example, a cache program operation for a two-bit memory operating in single page (lower page/upper page format) program mode. FIG. 13 is a simplified version of FIG. 10 that shows some specific elements that are relevant to the present discussion in a two-bit embodiment, the other elements being suppressed to simplify the discussion. These include data latch DL0 434-0, which is connected Data I/O line 231, data latch DL1 434-1, connected to common processor 500 by line 423, data latch DL2 434-2, commonly connected with the other data latches by line 435, and sense amp data latch DLS 214, which is connected to common processor 500 by line 422. The various elements of FIG. 13 are labeled according to their disposition during the programming of the lower page. The latch DL2 434-2 is used for the lower verify (VL) in quick pass write mode, as is described in U.S. patent application entitled "Use of Data Latches in Multi-Phase Programming of Non-Volatile Memories" filed concurrently with the present application; the inclusion of the register, and of using quick pass write when it is included, are optional, but the exemplary embodiment will include this register.

The programming of the lower page can include the following steps:

(1) The process begins by resetting data latches DL0 434-0 the default value "1". This convention is used to simplify partial page programming as cells in a selected row that are not to be programmed will be program inhibited.

(2) Program data is supplied to DL0 434-0 along I/O line 231.

(3) The program data will be transferred to DL1 434-1 and DL2 434-2 (if this latch is included and quick pass write is implemented).

(4) Once the program data is transferred to DL 1 434-1, data latch DL0 434-0 can be reset to "1" and, during program time, the next data page can be loaded to DL0 434-0 along I/O line 231, allowing the caching of a second page while a first page is being written.

(5) Once the first page is loaded into DL1 434-1, programming can begin. DL1 434-1 data is used for lockout of the cell from further programming. DL2 434-2 data is used for the lower verify lockout that governs the transition to the second phase of quick pass write, as described in U.S. patent application entitled "Use of Data Latches in Multi-Phase Programming of Non-Volatile Memories" filed concurrently with the present application.

(6) Once programming begins, after a programming pulse, the result of the lower verify is used to update DL2 434-2; the result of the higher verify is used to update DL1 434-1. (This discussion is based on the "conventional" coding, where the lower page programming is to the A state. This, and other codings are discussed further in U.S. patent applications entitled "Use of Data Latches in Multi-Phase Programming of Non-Volatile Memories" filed concurrently with the present application and entitled "Non-Volatile Memory and Method with Power-Saving Read and Program-Verify Operations", filed Mar. 16, 2005. The extension of the present discussion to other codings follows readily.)

(7) In determining of whether programming is complete, only the DL 1 434-1 registers of the cells of row (or appropriate physical unit of program) are checked.

Figure 14:
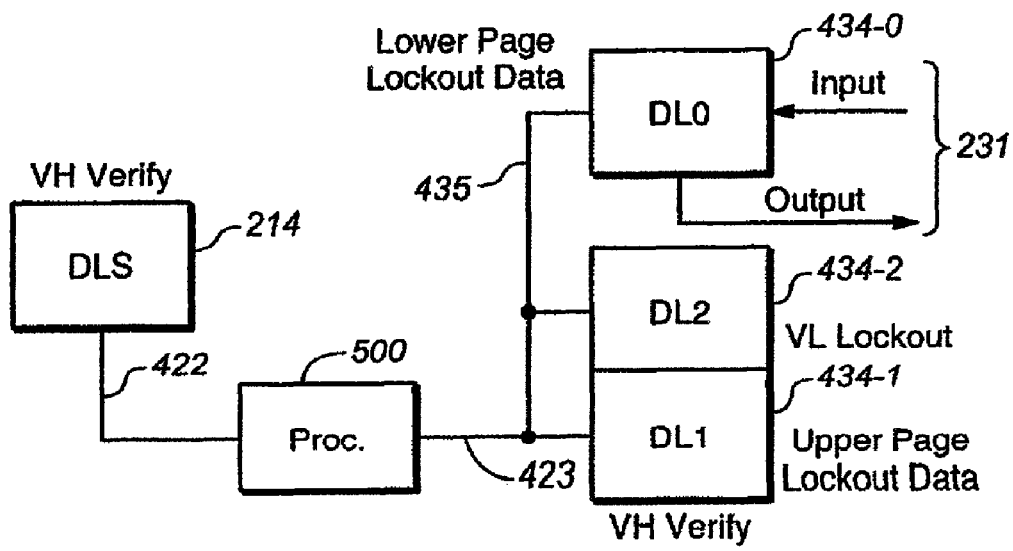

Once the lower page is written, the upper page can be programmed. FIG. 14 shows the same elements as FIG. 13, but indicates the latch assignment for upper page program where the lower page data is read in. (The description again uses conventional coding, so that the programming of the upper page is to the B and C states.) The programming of the upper page can include the following steps:

(1) Once the lower page finishes programming, the upper page (or next page) write will begin with a signal from the state machine controller where the (unexecuted) cache program commands are kept.

(2) The program data will be transferred from DL0 434-0 (where it was loaded into in step (3) during lower page write) to DL1 434-1 and DL2 434-2.

(3) The lower page data will be read in from the array and placed into DL0 434-0.

(4) DL1 434-1 and DL2 434-2 are again respectively used for the verify high and verify low lockout data. Latch DL0 434-0 (holding the lower page data) is checked as program reference data, but is not updated with the verify results.

(5) As part of verifying the B state, after sensing at the lower verify VBL, the data will be updated in DL2 434-2 accordingly, with DL1 434-1 data being updated with the high verify VBH results. Similarly, the C verify will have corresponding commands to update latches DL2 434-2 and DL1 434-1 with the respective VCL and VCH results.

(6) Once the B data is completed, then the lower page data (held in DL0 434-0 for reference) is not needed as only the verify for the C state needs to be performed. DL0 434-0 is reset to "1" and another page of program data can be loaded in from I/O line 231 and cached in latch DL0 434-0. The common processor 500 can set an indication that that only the C state is to be verified.

(7) In determining of whether upper page programming is completed, for the B state, both of latches DL1 434-1 and DL0 434-0 are checked. Once the cells being programmed to the B state and only the C state is being verified, only the latch DL1 434-1 data needs to be checked to see if there are any bits not programmed.

Note that under this arrangement, in step 6, the latch DL0 434-0 is no longer required and can be used to cache data for the next programming operation. Additionally, in embodiments using quick pass write, once the second, slowly programming phase is entered, the latch DL2 434-2 could also be made available for caching data, although, in practice, it is often the case that this is only available in this way for a fairly short time period that does not justify the additional overhead that is often required to implement this feature.

Figure 15:
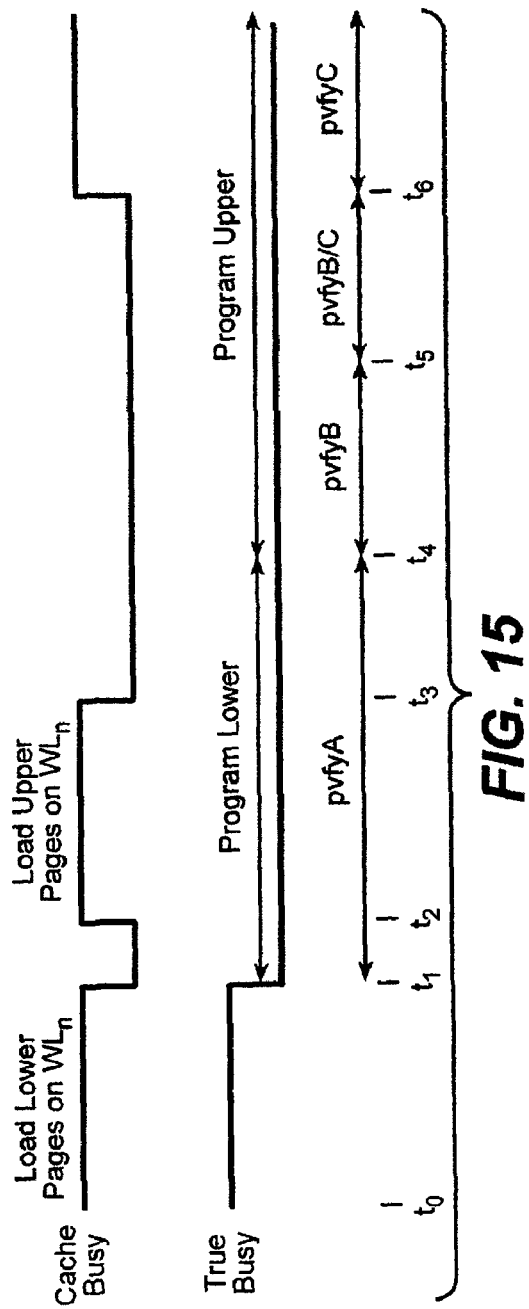
FIG. 15 illustrates aspects of cache program in the single page mode.

FIG. 15 can be used to illustrate many of the aspects of cache program in the single page mode that has been described in the last few paragraphs. FIG. 15 shows the relative timing of what events are occurring internally to the memory (the lower "True Busy" line) and as seen from external to the memory (the upper "Cache Busy" line).

At time $t_0$ the lower page to be programmed onto the selected word line (WLn) is loaded into the memory. This assumes the first lower page of data has not been previously cached, as it will be for the subsequent pages. At time $t_1$ the lower page is finished loading and the memory begins to write it. Since this is equivalent to a binary operation at this point, only the state A needs to be verified ("pvfyA") and the data latch DL0 434-0 is available to receive the next page of data, here taken as the upper pages to be programmed into WLn, at time $t_2$, which is consequently cached in latch DL0 434-0 during the programming of the lower page. The upper page finishes loading at time $t_3$ and can be programmed as soon as the lower page finishes at $t_4$. Under this arrangement, although all of the data (lower and upper page) to be written into physical unit of programming (here, word line WLn), the memory must wait from time $t_3$ to time $t_4$ before the upper page data can be written, unlike the full sequence embodiment described below.

The programming of the upper page begins at time $t_4$, where initially only the B state is verified ("pvfyB"), the C state being added at $t_5$ ("pvfyB/C"). Once the B state is no longer being verified at $t_6$, only the C state needs to be verified ("pvfyC") and the latch DL0 434-0 is freed up. This allows the next data set to be cached while the upper page finishes programming.

As noted, according to the single page algorithm with cache program, as shown in FIG. 15, even though the upper page data may be available at time $t_3$, the memory will wait until time $t_4$ before starting to write this data. In a conversion to a full sequence program operation, such as is developed more fully in U.S. patent application Ser. No. 11/013,125, once the upper page is available the upper and lower page data can be programmed concurrently.

The algorithm for cache program in full sequence (low to full conversion) write begins with lower page program as above. Consequently, steps (1)-(4) are as for the lower page process in single page program mode:

(1) The process begins by resetting data latches DL0 434-0 the default value "1". This convention is used to simplify partial page programming as cells in a selected row that are not to be programmed will be program inhibited.

(2) Program data is supplied to DL0 434-0 along I/O line 231.

(3) The program data will be transferred to DL1 434-1 and DL2 434-2 (if this latch is included and quick pass write is implemented).

(4) Once the program data is transferred to DL 1 434-1, data latch DL0 434-0 can be reset to "1" and, during program time, the next data page can be loaded to DL0 434-0 along I/O line 231, allowing the caching of a second page while a first page is being written.

Once the second page of data is loaded, if correspond to the upper of the lower page being written and the lower page is not yet finished programming, the conversion to full sequence write can be implemented. This discussion focuses on the use of the data latches in such an algorithm, with many of the other details being developed more full in co-pending, commonly assigned U.S. Pat. No. 7,120,051.

(5) After the upper page data is loaded into latch DL0 434-0, a judgment will be done in the address block to check if the 2 pages are on the same word line and the same block, with one page is the lower page and one is upper page. If so, then the program state machine will trigger a lower page program to full sequence program conversion if this is allowed. After any pending verify is complete, the transition is then effected.

(6) Some operation parameters will be typically be changed when the program sequence changed from lower page to full sequence. In the exemplary embodiment these include:

(i) Maximum program loop for the number of pulse verify cycles will be changed from that of the lower page algorithm to that of the full sequence if the lower page data has not been locked out, but the number of program loops completed will not be reset by the conversion.

Figure 16:
FIG. 16 shows a programming waveform that can be used in a lower page to full sequence conversion.

(ii) As shown in FIG. 16, the programming waveform starts with the value VPGM_L used in the lower page programming process. If the programming waveform has progressed to where it exceeds the beginning value VPGM_U used in the upper page process, at conversion to full sequence, the staircase will drop back down to VPGM_U prior to continuing up the staircase.

(iii) The parameters determining the step size and maximum value of the program pulse are not changed.

(7) A full sequence read of the current state of the memory cells should be performed to guarantee the right data will be programmed for multi-level coding. This ensures that states that may have formerly locked out in the lower page programming, but which require further programming to take account of their upper page data, are not program inhibited when the full sequence begins.

(8) If quick pass write is activated, the data of latch DL2 434-2 will be updated as well to reflect the upper page program data, since this was formerly based on the lower verify for only the A state.

(9) The programming then resumes with the multi-level, full sequence program algorithm. If the program waveform in the lower page process has increased beyond the upper page starting level, the waveform is stepped back to this level at conversion time, as shown in FIG. 16.

Figure 17:
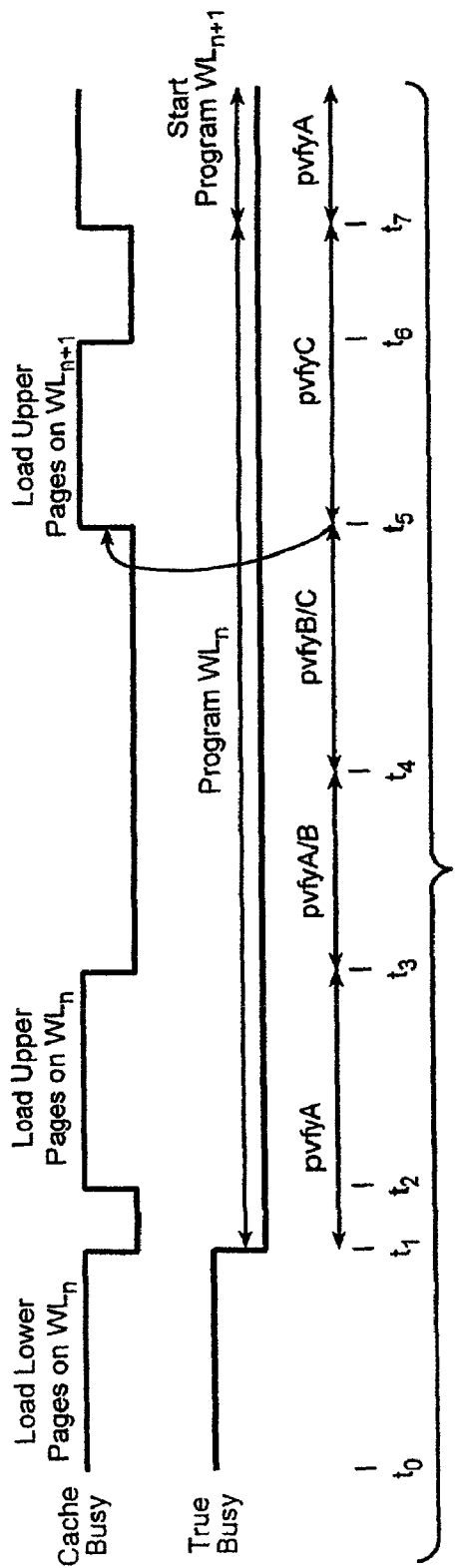
FIG. 17 illustrates the relative timing in a cache program operation with a full sequence conversion.

FIG. 17 is a schematic representation of the relative times involved in the lower page to full sequence conversion write process. Up until time $t_3$, the process is as described above for the process in FIG. 15. At $t_3$ the upper page of data has been loaded and the transition is made to the full sequence algorithm the verification process is switched to include the B states with the A states. Once all of the A states lock out, the verify process switches to checking for the B and C states at time $t_4$. Once the B states have verified at $t_5$, only the C state needs to be checked and a register can be freed up to load the next data to be programmed, such as the lower page on the next word line ($WL_{n+1}$) as indicated on the Cache Busy line. At time $t_6$ this next data set has been cached and one the programming of the C data for the previous set concludes at $t_7$, this next data set begins programming. Additionally, while the (here) lower page on word line $WL_{n+1}$ is programming, the next data (such as the corresponding upper page data) can be loaded into the open latch DL0 434-0.

During the full sequence write, a status report is implemented in a way that gives lower page and upper page status independently. At the end of the program sequence, if there are unfinished bits, a scan of physical page can be performed. A first scan can check latch DL0 434-0 for unfinished upper page data, a second scan can check DL1 434-1 for unfinished lower page data. Since, the verification of the B state will change both DL0 434-0 and DL1 434-1 data, an A state verification should be performed in the way that DL1 434-1 data "0" will be changed to "1" if the bit's threshold value is higher than the A verify level. This post verify will check on whether any under programmed B levels are passing at the A level; if they are passing at the A level, then the error is only on upper page and not on lower page; if they are not passing at the A level, then both lower and upper pages have error.

If the cache program algorithm is used, after the A and B data are programmed, the C state will be transferred to latch DL1 434-1 to finish programming. In this case, the scan of latch is not necessary for lower page, because the lower page will have already passed program without any failed bits.

Another set of exemplary embodiments of the present invention relate to page copy operations, where a data set is relocated from one location to another. Various aspects of data relocation operations are described in U.S. patent application publication Nos. US-2005-0257120-A1; US-2006-0136687-A1; and US-2006-0031593-A1; and U.S. Pat. No. 6,266,273, which are all hereby incorporated by reference, which are all hereby incorporated by reference. When data is copied from one location to another, the data is often toggled out to be checked (for error, for example), updated (such as updating a header), or both (such correcting detected error). Such transfers are also to consolidate date in garbage collection operations. A principal aspect of the present invention allows for a data read to an open register to be interpolated during the verify phase of a write operation, with this cached data then being transferred out of the memory device as the write operation continues, allowing the time for toggling the data out to hide behind the write operation.

Figure 18:
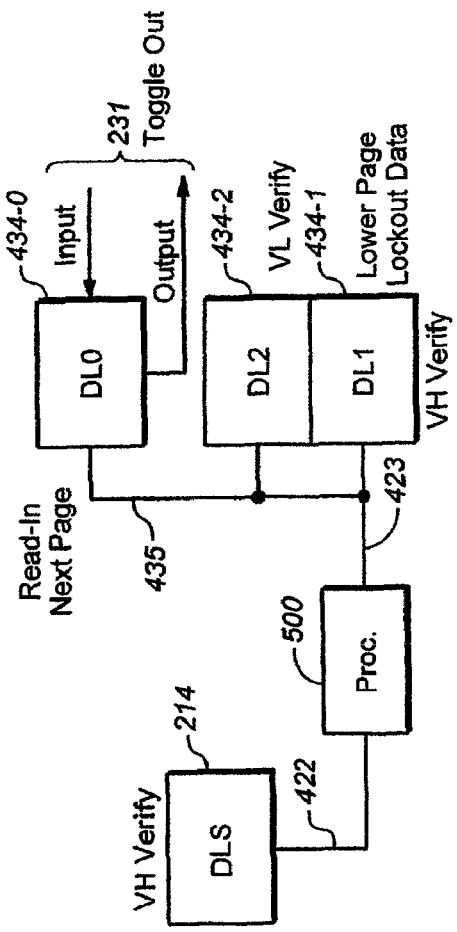
FIG. 18 describes the disposition of latches in a cache page copy operation.

The following presents two exemplary embodiments of a cache page copy operation. In both cases, an implementation that uses a quick pass write implementation is described. FIG. 18 indicates the disposition of the exemplary arrangement of latches as the process progresses.

The first version of cache page copy will write to a lower page and can include the following steps, where read addresses are labeled M, M+1, . . . , and write addresses are labeled N, N+1, . . . :

(1) The page to be copied ("page M") is read into latch DL1 434-1. This can be either an upper or lower page of data (2) Page M is then transferred into DL0 434-0.

(3) The data in DL0 434-0 is then toggle out and modified, after which it is transferred back into the latch.

(4) The program sequence can then begin. After data to be written into the lower page N is transferred to DL1 434-1 and DL2 434-2, the latch DL0 434-0 is ready for cache data. This lower page will be programmed. For this embodiment, the program state machine will stop here.

(5) The next page to be copied is then read into DL0 434-0. Programming can then resume. The state machine, stopped at the end of step (4), will restart the program sequence from the beginning.

(6) Programming continues until the lower page finishes.

The copy destination page address will determine whether a write is to a lower or an upper page. If the program address is an upper page address, then the programming sequence will not be stopped until the programming finishes and the read of step (5) will be executed after the write is complete.

In a second cache page copy method, the program/verify process can be paused to insert a read operation and then restart the write operation, picking up at the point where it left off. The data that was read during this interleaved sensing operation can then be toggled out while the resumed write operation continues on. Also, this second process allows for the page copy mechanism to be used in an upper page or full sequence write process once only the C state is being verified and one latch on each bit line opens up. The second cache page copy operation begins with the same first three steps as in the first case, but then differs. It can include the following steps:

(1) The page to be copied ("page M") is read into latch DL1 434-1. This can be either a lower or upper page (2) The data from page M is then transferred into DL0 434-0. (As before, N, etc. will denote a write address, M, etc., for a read address.)

(3) The data in DL0 434-0 is then toggled out, modified, and then transferred back to the latch.

(4) The state machine program will go to an infinite wait state until the command a read command is entered and then a read of another page, say the next page M+1, to latch DL0 434-0 will begin.

(5) Once the read of step (4) is complete, the address is switched back to word line and block address to program the data in steps (1-3) into page N (here, a lower page) and the programming is resumed.

(6) After the read of page M+1 is finished, the data can be toggled out, modified, and returned. Once the process is complete, the write can be converted to a full sequence operation if the two pages are the corresponding upper and lower pages on the same WL.

(7) Once the A and B levels are done in the full sequence write, the data in DL0 434-0 will be transferred to DL1 434-1, as in the normal cache program described earlier, and a read command for another page (e.g., page M+2) can be issued. If there is not a single page to full sequence conversion, the lower page will finish the writing and then the upper page will start. After the B level state is done completely, the same DL0 434-0 to DL1 434-1 data transfer will occur, and the state machine will go into state of waiting for the read command for page M+2.

(8) Once the read command arrives, the address is switched to the read address and the next page (page M+2) is read out.

(9) Once the read is complete, the address will be switched back to previous upper page address (program address N+1) until the write finishes.

As noted above, the exemplary embodiments include the latch DL2 434-2 used for the lower verify of the quick pass write technique in addition to the latches DL0 434-0 and DL1 434-1 used in holding the (here, 2 bits) of data that can be programmed into each of the memory cells. Once the lower verify is passed, the latch DL2 434-2 may also be freed up and used to cache data, although this is not done in the exemplary embodiments.

Figure 19A:
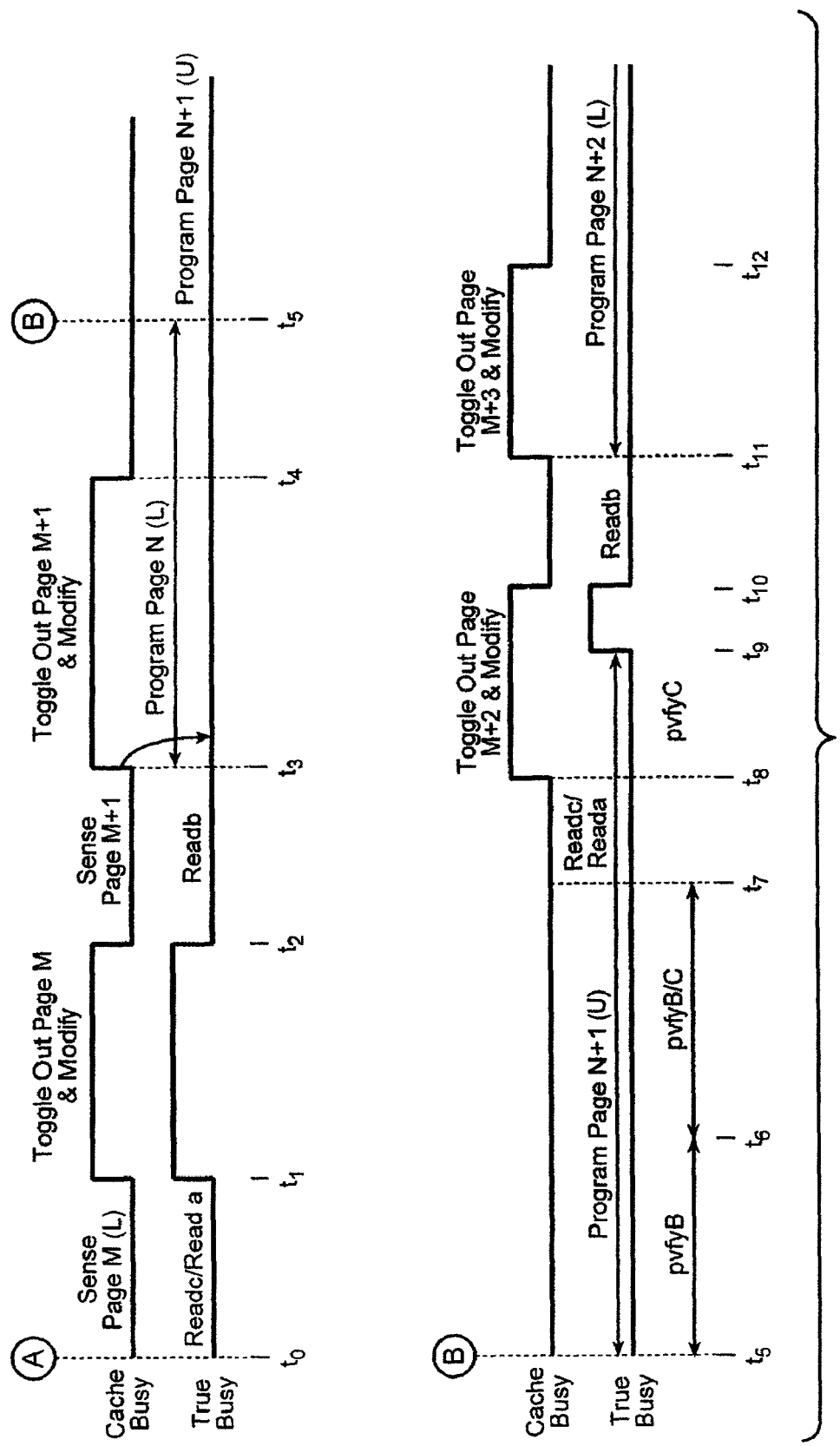
FIGS. 19A and 19B illustrate the relative timings in cache page copy operations.
Figure 19B:
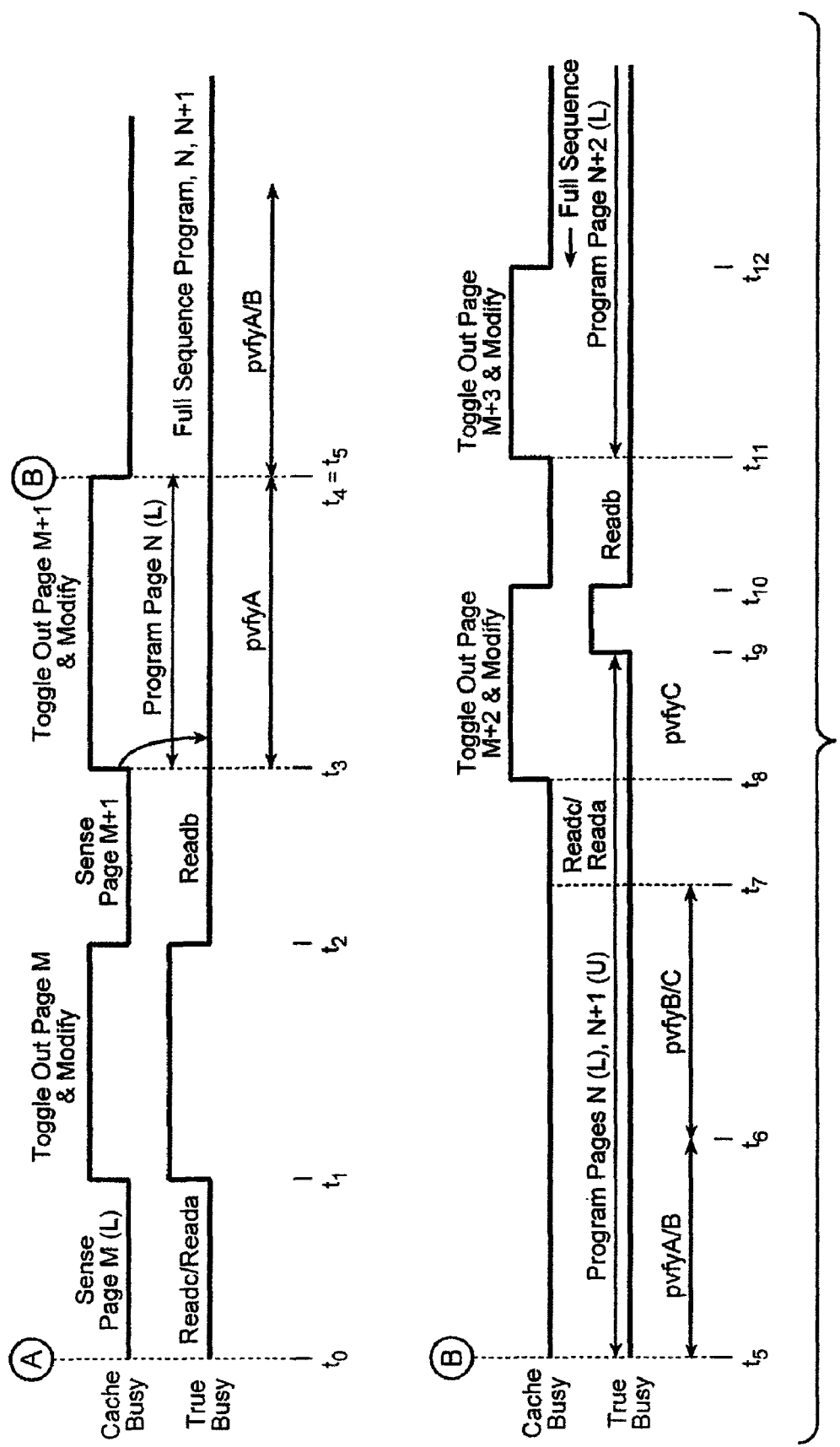

FIGS. 19A and 19B illustrate the relative timing of the second cache page copy method, where FIG. 19B illustrates the algorithm with the full sequence write conversion and FIG. 19A illustrates the algorithm without. (Both FIGS. 19A and 19B are composed of two parts, the first, upper part beginning at the broken vertical line A, corresponding to $t_0$, and ending with the broken vertical line B, corresponding to $t_5$; the second, lower part is a continuation of the upper portion and begins with the broken vertical line B, corresponding to $t_5$. In both cases the line B at time $t_5$ is same in the upper portion as in the lower portion, being just a seam in two parts allowing it to be displayed on two lines.)

FIG. 19A shows a process that starts with reading of a first page (page M) that is taken to be a lower page in this example, assumes no data has previously been cached, and operates in single page mode, waiting until the lower page has finished writing before beginning to write the upper page. The process starts at time $t_0$ with a read of the page M (Sense page M (L)), which here is a lower that is sensed by a read at the A and C levels in this coding. At time at time $t_1$ the read is complete and page M can be toggled out and checked or modified. Beginning at time $t_2$ a next page (here page M+1, the upper page corresponding to the same physical as lower page M) is sensed by reading at the B level, a process that finishes at time $t_3$. At this point, the first page (originating from Page M) (lower) is ready to be programmed back into the memory at page N and the data read from page M+1 is being held in a latch and can be transferred out to be modified/checked. Both of these processes can start at the same time, here $t_3$. Using the typical time values described above, the data from page M+1 has been toggled out and modified by time $t_4$; however, for the embodiment not implementing a full sequence conversion, the memory will wait until page N finishes at time $t_5$ to begin writing the second read page of data (originating from Page M+1) into page N+1.

As page N+1 is an upper page, its write begins initially with a verification at the B level, the C level being added at $t_6$. Once the storage elements having a target state B all lock out (or the maximum count is reached) at time $t_7$, the B state verification is dropped. As described above, according to several principal aspects of the present invention, this allows a data latch to be freed up, an ongoing write operation is suspended, a reading operation (at a different address than the suspended program/verify operation) is interposed, the write then resumes where it left off, and the data sensed the interposed write operation can be toggled out while the resumed write operation runs on.

At time $t_7$ the interposed write operation is performed for the, here, lower page M+2. This sensing is finished at time $t_8$ and the write of page N+1 picks back up and the data from page M+2 is concurrently toggled out and modified. In this example, page N+1 finishes programming at time $t_9$ before page M+2 is finished at time $t_{10}$. At time $t_{10}$ a write of the data originating from page M+2 could begin; however, in this embodiment, instead a read of page M+3 is first executed, allowing for this page's data to be toggled out and the modification to be hidden behind the writing of the data originating from page M+2 into page N+2, beginning at time $t_{11}$. The process then continues on as in the earlier parts of the diagram, but with the page numbers shifted, with time $t_{11}$ corresponding to time $t_3$, time $t_{12}$ corresponding to time $t_4$, and so on until the copy process is stopped.

FIG. 19B again shows a process that starts with reading of a lower page, page M that is taken to be a lower page, and assumes no data has previously been cached. FIG. 19B differs from FIG. 19A by implementing a conversion to full sequence write at time $t_4$. This roughly speeds up the process by the time ($t_5$-$t_4$) of FIG. 19A. At time $t_4$ (=$t_5$ in FIG. 19A), the various changes related to the full sequence conversion are implemented as described previously. Otherwise, the process is similar to that of FIG. 19A, including those aspects of the present invention found between times $t_7$ and $t_{12}$.

In both the page copy processes and the other techniques described here that involve writing data, which states are verified at a given time can be selected intelligently, along the lines describe in U.S. patent publication number US-2004-0109362-A1, which is hereby incorporated by reference. For example, in the full sequence write, the write process can begin verifying only the A level. After ever A verify, it is checked to see whether any bits have passed. If so, the B level can be added to the verify phase. The A level verify will be removed after all storage units with it as their target values verify (or except a maximum count based on a settable parameter). Similarly, after the verifications at the B level, a verify of the C level can be added, with the B level verify being removed after all storage units with it as their target values verify (or except a maximum count based on a settable parameter).

Programming operation with background data caching for other operations is described with respect to a preferred multi-state coding.

Exemplary Preferred "LM" Coding for a 4-State Memory

Figure 20:
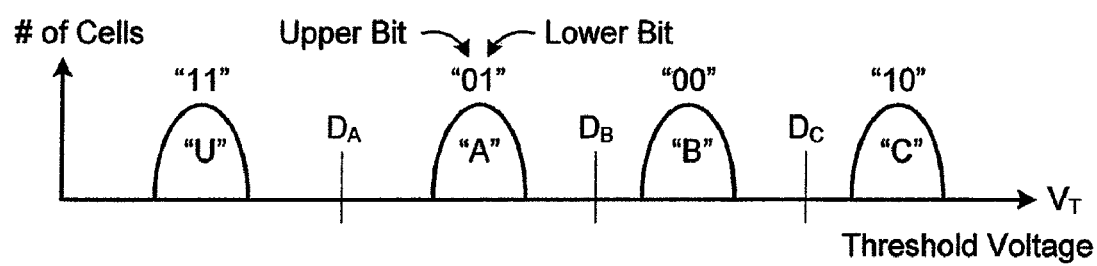
FIG. 20 illustrates threshold voltage distributions of the 4-state memory array when each memory cell stores two bits of data using the LM code.

FIG. 20 illustrates the programming and reading of the 4-state memory encoded with a 2-bit logical code ("LM" code). This code provides fault-tolerance and alleviates the neighboring cell coupling due to the Yupin Effect. FIG. 20 illustrates threshold voltage distributions of the 4-state memory array when each memory cell stores two bits of data using the LM code. The LM coding differs from the conventional Gray code in that the upper and lower bits are reversed for states "A" and "C". The "LM" code has been disclosed in U.S. Pat. No. 6,657,891 and is advantageous in reducing the field-effect coupling between adjacent floating gates by avoiding program operations that require a large change in charges.

The coding is designed such that the 2 bits, lower and upper, may be programmed and read separately. When programming the lower bit, the threshold level of the cell either remains in the unprogrammed region or is moved to a "lower middle" region of the threshold window. When programming the upper bit, the threshold level in either of these two regions is further advanced to a slightly higher level not more than one quarter of the threshold window.

Psuedo and User Driven Randomization of Data Patterns

Various embodiments of a memory EEPROM or chip and method of randomization seek to minimize the problems that result from repetitive data storage patterns such as increased NAND string resistance, decreased endurance and reliability, and unwanted coupling. The pseudo randomization techniques of the present invention are practical and in terms of data processing capacity, they are not costly to implement.

The present invention includes different embodiments and methods implementing pseudo-randomization and true user based randomization of the stored data on the flash memory chip. All the embodiments have the advantage of requiring only simple and small circuit modifications to be implemented in a flash EEPROM. This is noteworthy because the randomization techniques and circuitry are not computationally intensive and are implemented with little if any performance penalty. The solutions of the present invention are also flexible in that the randomization can be easily enabled or disabled at any time. Furthermore, the pattern of pseudo randomization utilized in certain embodiments can be varied in many ways and easily changed in time.

Figure 21:
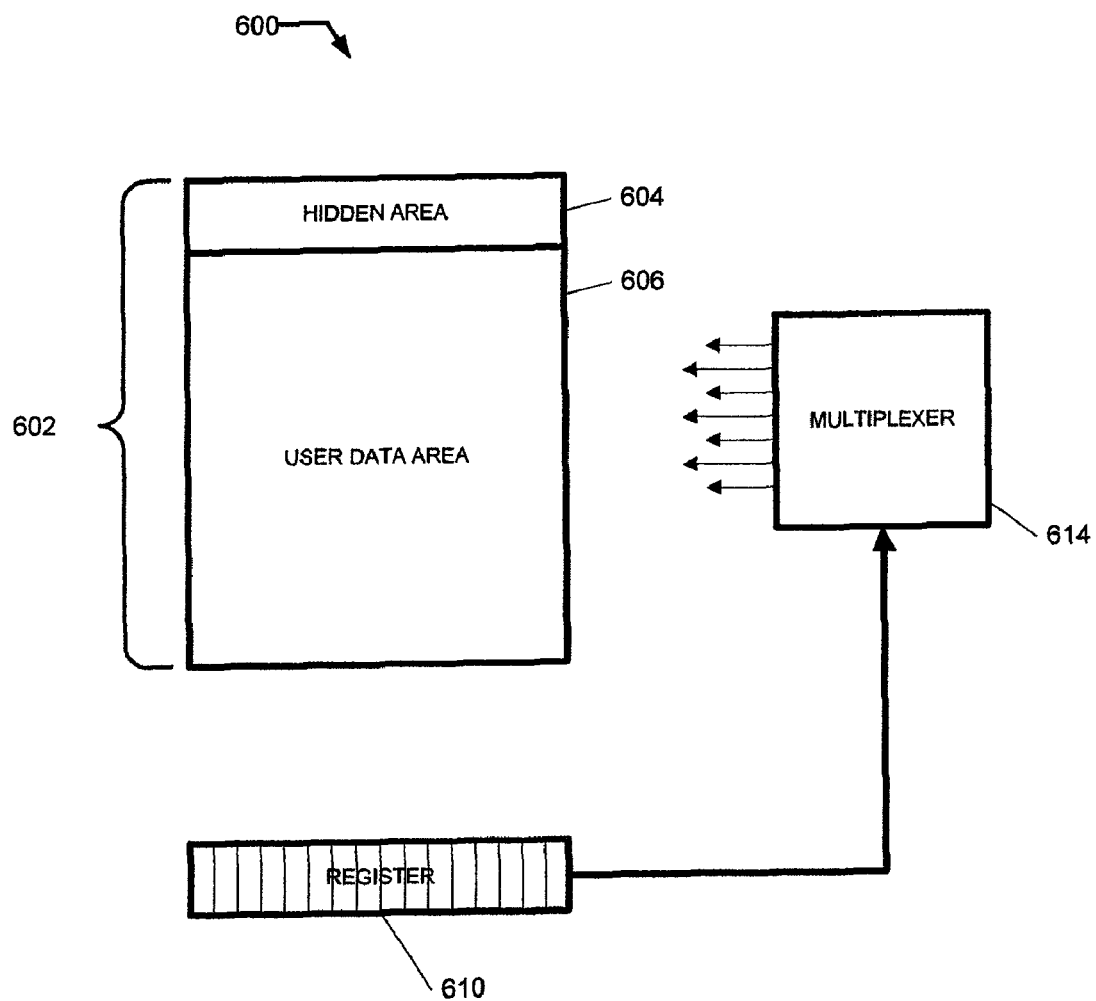
FIG. 21 is a schematic block diagram of certain components of EEPROM or memory chip 600.

FIG. 21 illustrates the main components of EEPROM or memory chip 600 that are relevant to the randomization process. Chip 600 comprises memory array 602, register(s) 610 in the peripheral circuitry, and multiplexer 614. Other components of chip 600 will be illustrated in and described in reference to the additional figures. Register 610 is capable of holding multiple bits and may comprise multiple registers. In some embodiments it functions as a shift register. Memory array 602 comprises a hidden area 604 and user data area 606. The hidden area may be used to store firmware and other overhead data such as memory operation control codes. In a NAND architecture, as was described earlier, the data is organized in blocks, each of which may comprise multiple pages of data. In certain embodiments, neither the register 610, nor the multiplexer 614 will be present.

The various embodiments of the present invention will reduce or eliminate long term and repeated storage of specific data patterns which can cause program disturbs or user read disturbs. It does so by varying the encoding of the data by either pseudo random mechanisms or by user triggered randomization. Because the timing of user activity is completely unpredictable, using the activity as a trigger results in a truly random sequence of encoding schemes. Each of the embodiments will also reduce NAND string resistance effect, increase memory endurance and reliability, and reduce the problem of floating gate to floating gate coupling.

Each of the embodiments requires only minimal modification to the circuitry of the flash EEPROM, yet at the same time will drastically increase the randomness of the data storage, and therefore increase the performance of the EEPROM. The randomization of the data may be either enabled or disabled easily within the array. Further, the sequence responsible for the pseudo randomization may continually change, providing flexibility within the system.

Figures 22A, 22B:
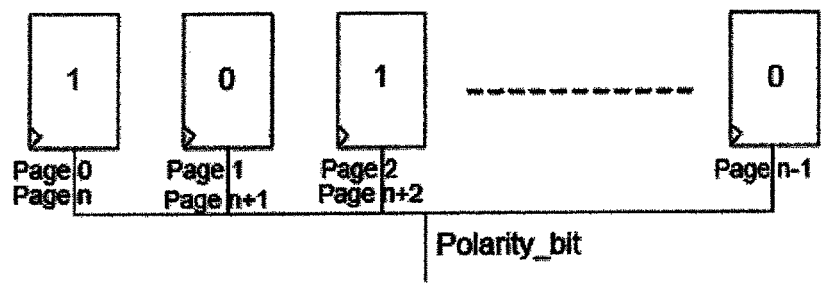
FIG. 22A is an illustration of the encoding scheme and polarity bit of various pages of data by page address.
FIG. 22B is a table illustrating the application of an example 17 bit code used to transform the encoding of user data.

In one embodiment, a code or sequence of bits, which can be either a zero or one, is stored in the hidden area 604 of array 602. The portion of hidden area 604 where the code is stored may be referred to as a "ROM block." The code may comprise 2 or more bits, but preferably comprises 17 or more bits. The more bits, the greater the randomization will be. Upon power up of the chip 600, the value is loaded into register 610. Each bit in the register is assigned to a specific page address. Each bit is compared to the page address of a page, and based on the comparison, the encoding of the data of the page will be inverted or will remain the same (passed) for the page. For example, a 0 value for the bit may be used to indicate that the encoding scheme of the data will remain the same, whereas a value of 1 in the register may indicate that the encoding of data within a page will be inverted. If the code comprises less bits than the number of pages within a block, the code may be applied to more than one group of one or more pages. In other words, the code can be used repeatedly in series until all pages are compared. The code may also be changed between cycles. Alternatively, the code may be multiplexed through multiplexer 614 so that one bit of one code will determine the encoding of multiple pages of data stored in the user data area 602. Each bit of the code can be referred to as a polarity bit, as it acts to change the polarity of the encoding employed for some portion of user data. This is depicted in FIG. 22A. In this case, the encoding is based on the page address, such that it is known that pages 0, N have a polarity of 1, whereas pages 1, n+1 have a polarity 0, and pages 2, n+2 have polarity 1 and so forth. Therefore, in an embodiment where the encoding is based upon the page address, it is not necessary to store the polarity bit with the page, although it may be done for redundancy purposes.

Table 1, seen below and reproduced as FIG. 22B, illustrates the application of the polarity bits of the code in register 610 to portions of user data. While any portion of user data may be compared and associated with a particular polarity bit, the preferred embodiments described illustrate a page as the basic unit.

bits may be physically located in a single memory cell. The same or a different code could be applied to another group of data such that the group of data corresponding to bit 17 would be used in conjunction with the data corresponding to bit 1 of the next code applied to determine the state. Each polarity register will control the polarity for all the data on the corresponding page. The lower and upper bits are preferably located on the same physical wordlines. The example given in Table 1 illustrates the function of polarity bits to convert a simple pattern to random pattern(s) across many wordlines. The randomization is achieved on the data located on the same NAND chain structure, an example of which is provided in FIG. 22C to illustrate this concept.

Figure 22C:
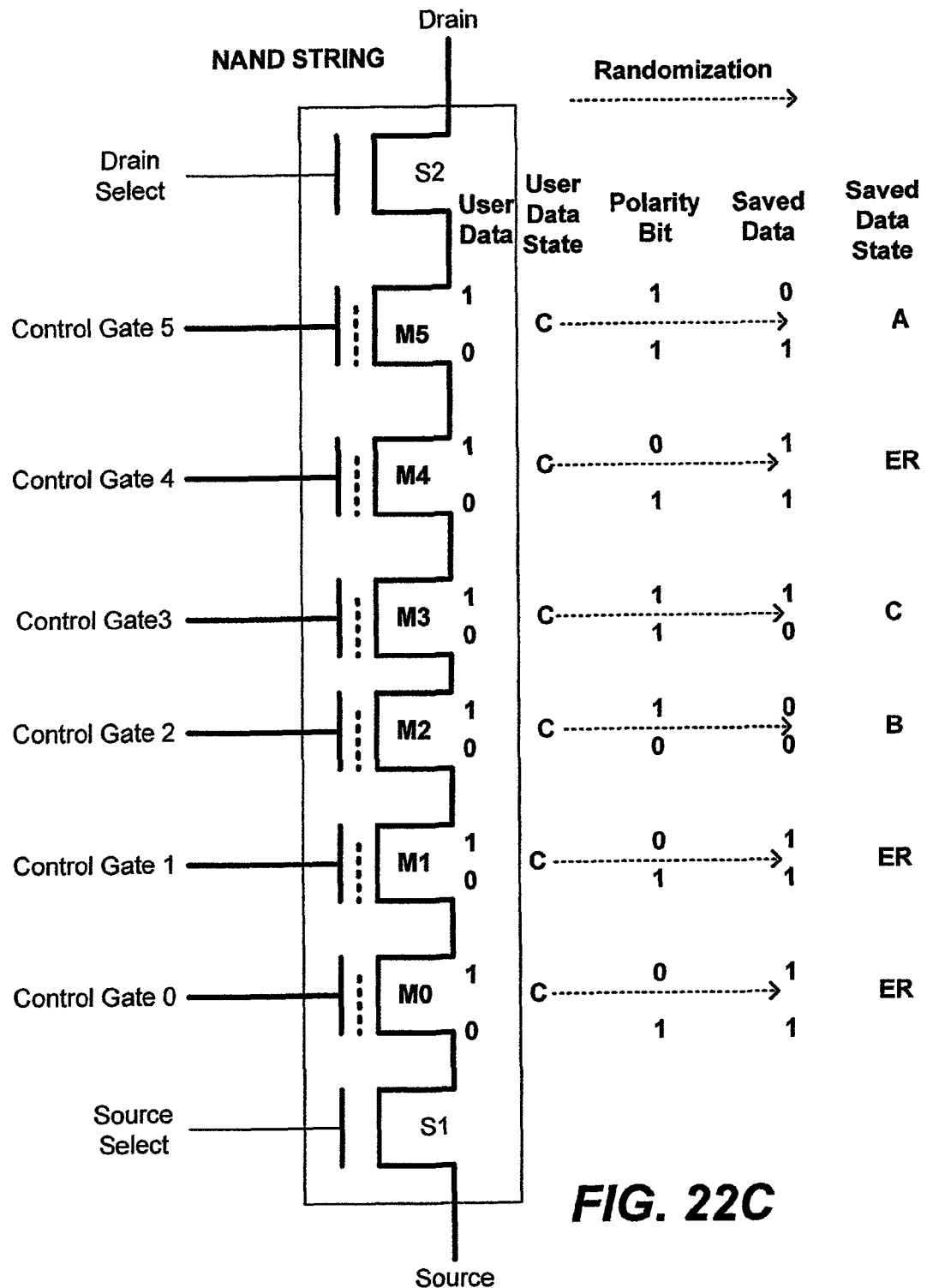
FIG. 22C illustrates application of polarity bits to the upper and lower bits stored in the memory cells of an exemplary NAND chain/string.

In FIG. 22C, the lower and upper bits of a given cell are illustrated at each of the illustrated cells of the NAND string or chain. The NAND string shown is simply an example, and there may of course be more or less cells in a string, and structures different than that shown may be used with the present invention. For example, a cell storing 3, 4 or more bits may also be employed. Also, it should be remembered that the polarity bit preferably applies to a page or more of data, although application on the bit level is shown to illustrate the concept of bit inversion, especially in a multi state memory. In FIG. 22C, the polarity bits are applied to each bit of the user data, and the resulting user data, as inverted or passed by the polarity bit, is labeled as the saved data. The saved data is the data that will subsequently be written to the memory array and stored as a result of the randomization operation. As can be seen, the states indicated at the right of the figure are defined by the upper and lower bit of the cell. The "saved data" terminology employed in FIG. 22C corresponds to what is referred to as the "User Data (UD) subsequent encoding" in Table 1 and FIG. 22B.

FIG. 23A illustrates another embodiment in which the register shown in FIG. 21 is a shift register with a feedback. In such an embodiment, the register 610 is configured as a pseudo-random generator. Its content is cyclically fed back to generate a sequence of pseudo random numbers. In this way,

TABLE 1

|  | Register position | | | | | | | | | | | | | | | | |
| --- | --- | --- | --- | --- | --- | --- | --- | --- | --- | --- | --- | --- | --- | --- | --- | --- | --- |
|  | 1 | 2 | 3 | 4 | 5 | 6 | 7 | 8 | 9 | 10 | 11 | 12 | 13 | 14 | 15 | 16 | 17 |
| Code (polarity bit) | 1 | 0 | 1 | 0 | 0 | 1 | 1 | 1 | 1 | 0 | 0 | 0 | 1 | 1 | 0 | 1 | 0 |
| UD Original encoding | 0 | 1 | 0 | 1 | 0 | 1 | 0 | 1 | 0 | 1 | 0 | 1 | 0 | 1 | 0 | 1 | 0 |
| UD Subsequent encoding | 1 | 1 | 1 | 1 | 0 | 0 | 1 | 0 | 1 | 1 | 0 | 1 | 1 | 0 | 0 | 0 | 0 |
| State | ER | | ER | | B | | C | | ER | | A | | C | | B | | |

As seen in the table, each (polarity) bit of the code will determine whether the original encoding (data) of a bit will remain the same or will change. For example, looking at register position 1, the polarity code in that position has a value of 1. Thus, in an embodiment where a 1 indicates that the data will be inverted, an original bit of user data stored as a 0 will be inverted to a value of 1. The table illustrates a multi state cell, where 2 bits are used to define a state. The states are shown in FIG. 20, and as can be seen in FIG. 20, an upper and a lower bit define the states. In a 2 bit or 4 state memory cell of the type shown in FIG. 20, (1:1) defines an erase ("ER") or un-programmed ("U") state; (0:1) defines state A, (0:0) defines state B, and (1:0) defines state C. The upper and lower one bit will be used at a time, in contrast to the embodiment where all the bits of the code were used at a time. When a command is issued by a user, the shift register will shift to the next bit. The polarity bit used on the incoming user page will be from the last register output. This is preferably done on the rising edge of the command. The triggering command may be a program command, a cache program command, a read command, an erase command, or other user issued command. An example program command signal is shown in FIG. 23B. The clock signal associated with the command is shown, and the instantiation of the command will be triggered by the user request, the timing and type of which is unpredictable and essentially random. FIG. 23A illustrates the clock signal associated with the user command as the one of the inputs that determines the polarity bit. The other input in the figure is the user data. The application of the polarity bit would invert or leave as is, the encoding of the data, as described previously.

FIG. 23C illustrates an example of control circuitry for the data inversion. The data path with the single inverter will result in inverting of the encoding, whereas the path with the two inverters in series will result in the data encoding scheme being unaltered. In such a case, the polarity bit associated with a group of data will be stored with that group of data. For example, as seen in FIG. 23D, for a page of data 630, the polarity bit 632 for the data in user area 636 would be programmed into the hidden area 634 of the page 630. When the page 630 is read, the polarity bit 632 will be transferred out and latched to control the output data, and will revert the encoding scheme back if it was inverted, as accomplished by the exemplary circuitry shown in FIG. 23E. In this way, the polarity of the page will be reverted to its original encoding.

The pattern of the code utilized by the shift register can vary and can be modified for different applications. If all bits are set to zero (in the case where zero indicates no change) then the randomization will be disabled. While the pattern of the bits in the register is pseudo random, the user behavior is unpredictable, and the resulting polarity at any given time is thus also unpredictable and random. Two examples of user behavior are as follows: 1) the user programs some pages and jumps to a different address to read or program some pages or to erase some blocks, then the returns back to the block where the last program occurred and continues to program more pages; and 2) the user programs all the pages sequentially without jumping to another address. In case 1, a new polarity bit can be triggered for each user command, whereas in case 2 the sequential programming will utilize and be based on one polarity bit. Therefore, even though the original data the user wishes to store may be the same for both cases, the final programmed data in the memory will likely be different for at least some of the various individual pages and groups of pages in these 2 cases. Note that the EEPROM is typically controlled by a controller chip, and some of the actions of the "user" may be that of the controller chip.

In another embodiment, the polarity bit is also generated randomly as a result of a user command, such as the cache program operation described earlier. This embodiment utilizes two inputs that are not synchronized. The first is the timing of user commands, which as mentioned earlier is unpredictable. The second is a finite state machine clock. In certain memory systems, the finite state machine clock is only active at certain times (e.g. during cache operations), whereas in other systems it may always be active. This technique of this embodiment is available whenever the finite state machine clock of the memory system is active.

Figure 24A:
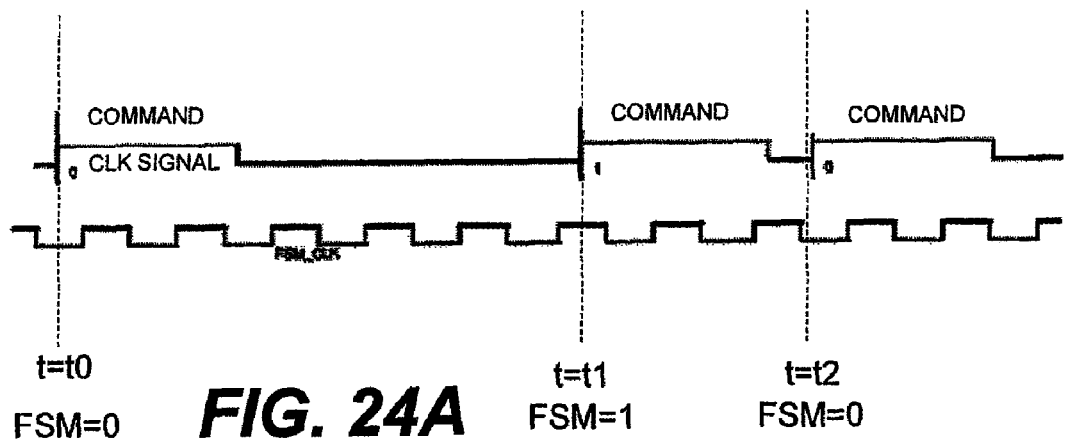
FIG. 24A is a timeline of a command clock signal and a finite state machine clock signal showing the value of the FSM clock at the rising edge of the command clock signal.
Figure 24B:
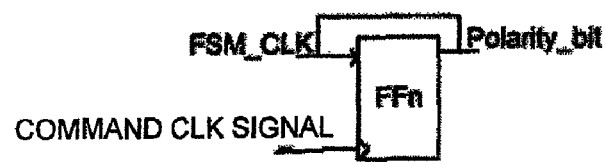
FIG. 24B illustrates exemplary circuitry to determine the polarity bit as a function of the command clock signal shown in FIG. 24A.

At the rising edge of the user command clock signal, the level or state of the finite state machine ("FSM") clock is referenced. The state may be either high or low, as seen in FIG. 24A. A low state may correspond to a polarity bit of zero (although the opposite correspondence is also possible). At time t=0, the FSM is low and thus the polarity bit would be zero, indicating no change of the data encoding, as mentioned previously. At time t=1, the FSM is high, and the polarity bit would be one, whereas at time t=3 it the FSM is again at a low state. In some embodiments, the polarity bit 632 is loaded into the hidden area 634 as soon as the executing command is issued and it is sensed. In other embodiments it may be temporarily stored in another memory of the system. FIG. 24B illustrates an exemplary circuit to determine the polarity bit as described above. The inverter would again be preferably be rising edge triggered.

Figure 25:
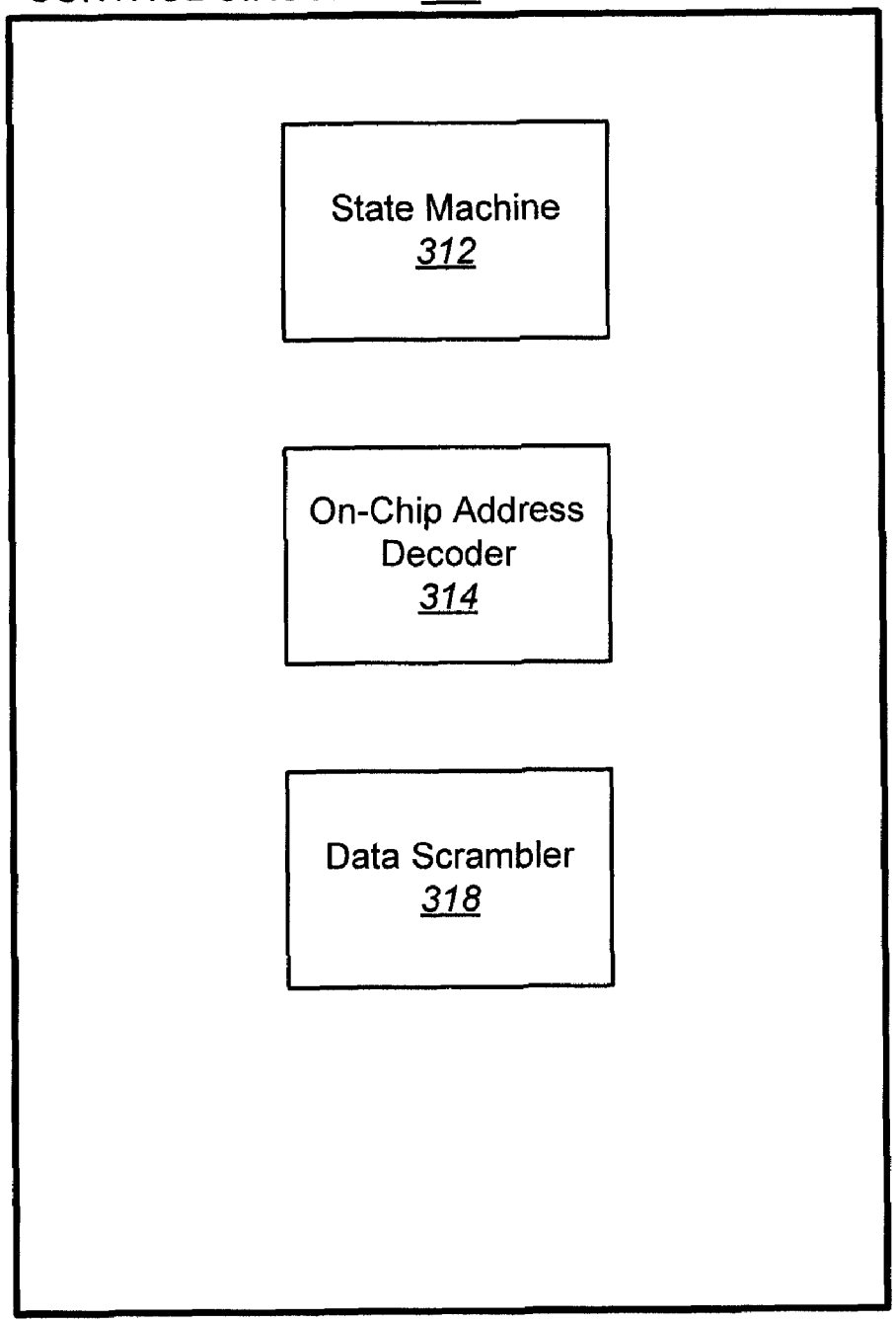
FIG. 25 illustrates the On-chip control circuitry shown in FIG. 7A and FIG. 9 in more detail.

FIG. 25 illustrates the On-chip control circuitry shown in FIG. 7A and FIG. 9 in more detail. In addition to the state machine 312 and the address decoder or generator 314, it also contains a data scrambler 318. In the preferred embodiment, it contains the register 610 and the multiplexer 614 shown in FIG. 21 and FIG. 23A. In another preferred embodiment, it also contains the data inverting circuit shown in FIG. 23C and the data reverting circuit shown in FIG. 23E.

As disclosed in FIG. 21 to FIG. 25 and associated text, each page of data accessible by a common word line is programmed or read in parallel. Randomization on a page-by-page basis is accomplished by pseudo randomly selecting certain pages to have the polarity of their bits flipped.

On-chip, page-by-page randomization of data is disclosed in U.S. application Ser. No. 11/530,392 filed on Sep. 8, 2006, entitled "Methods in a Pseudo Random and Command Driven Bit Compensation for the Cycling Effects in Flash Memory," by Yan Li et al, the entire disclosure of which is incorporated herein by reference.

On-Chip Pseudo-Randomization of Data Within a Page

It is desirable also to scramble the data within each page. This is advantageous for avoiding certain highly regular data pattern that could cause problem during programming and also for controlling source loading errors when sensing a page of data in parallel.

Figure 1A:
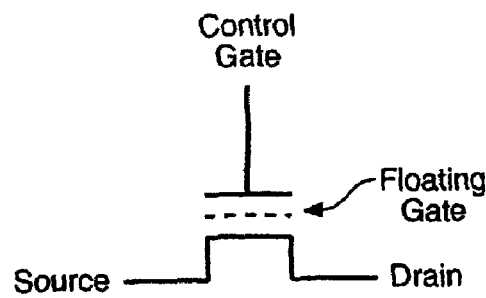
FIGS. 1A-1E illustrate schematically different examples of non-volatile memory cells.
Figure 1B:
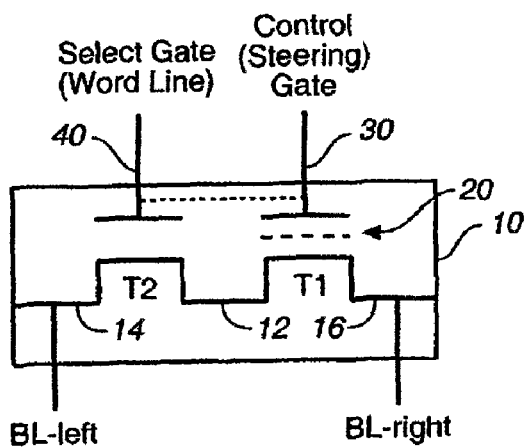
Figure 1C:
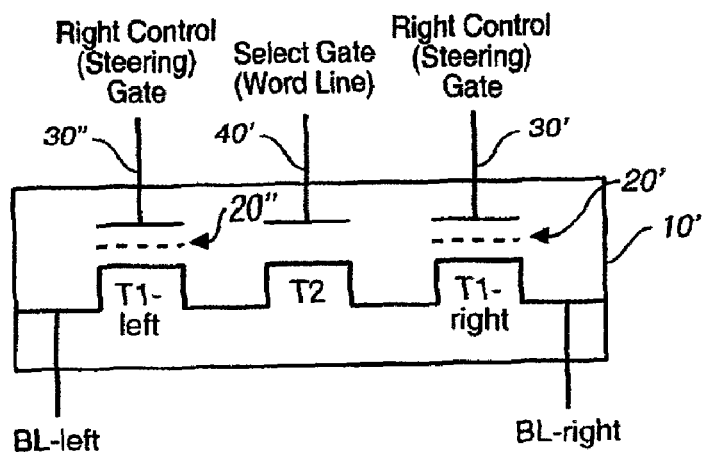
Figure 1D:
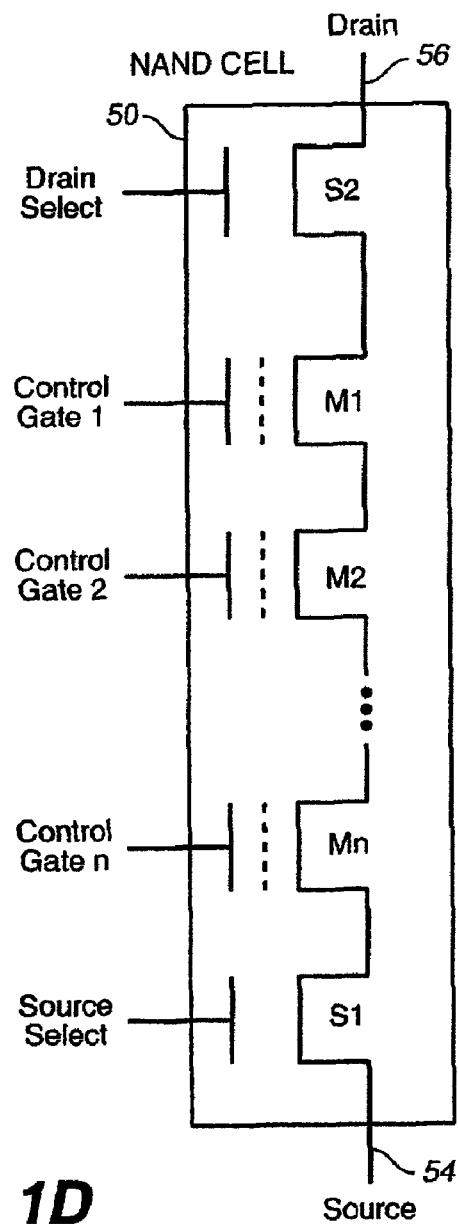
Figure 1E:
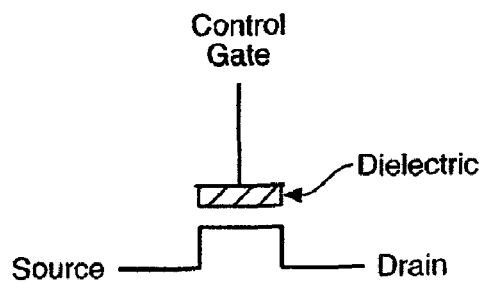
Figure 2:
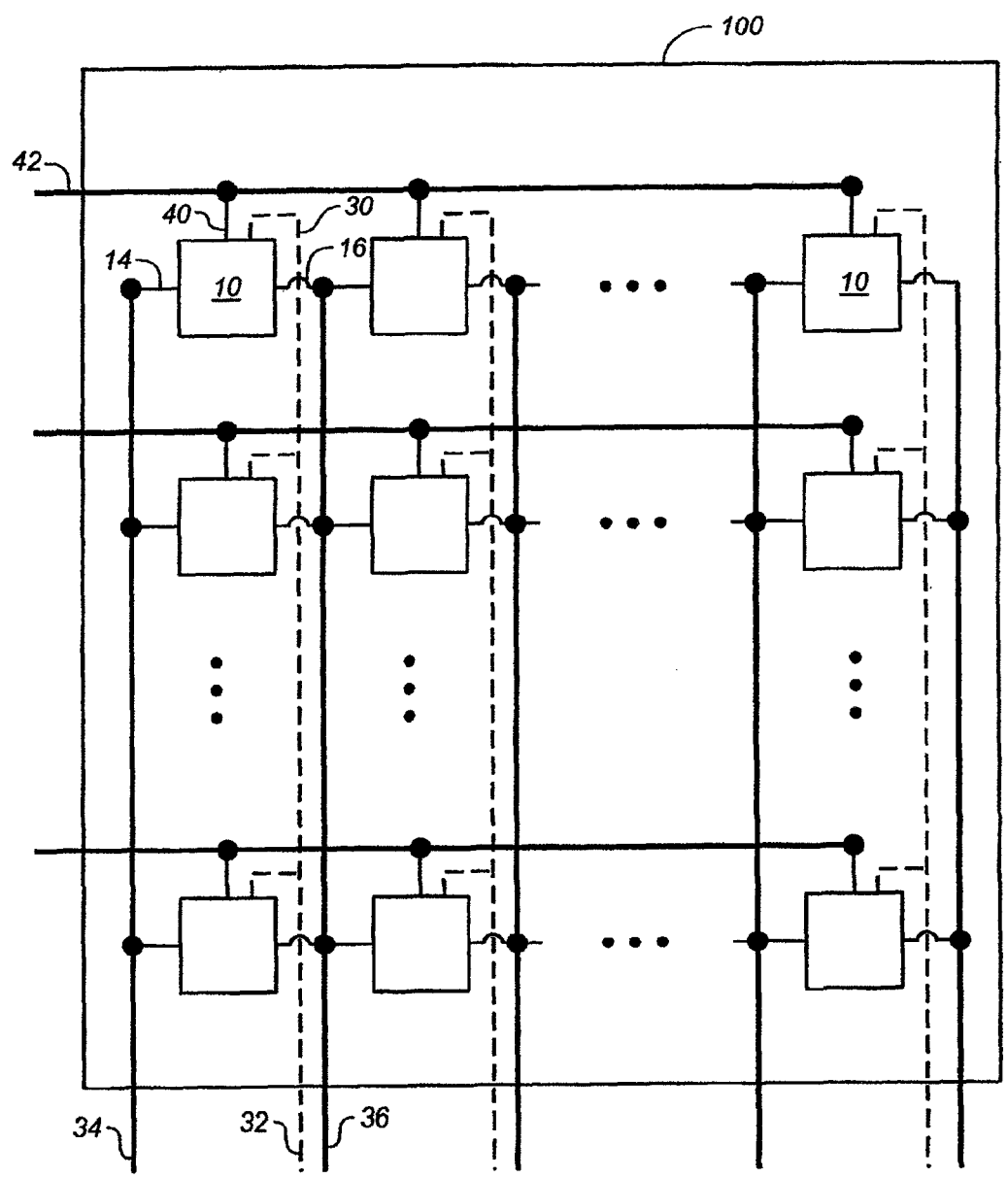
FIG. 2 illustrates an example of an NOR array of memory cells.
Figure 3:
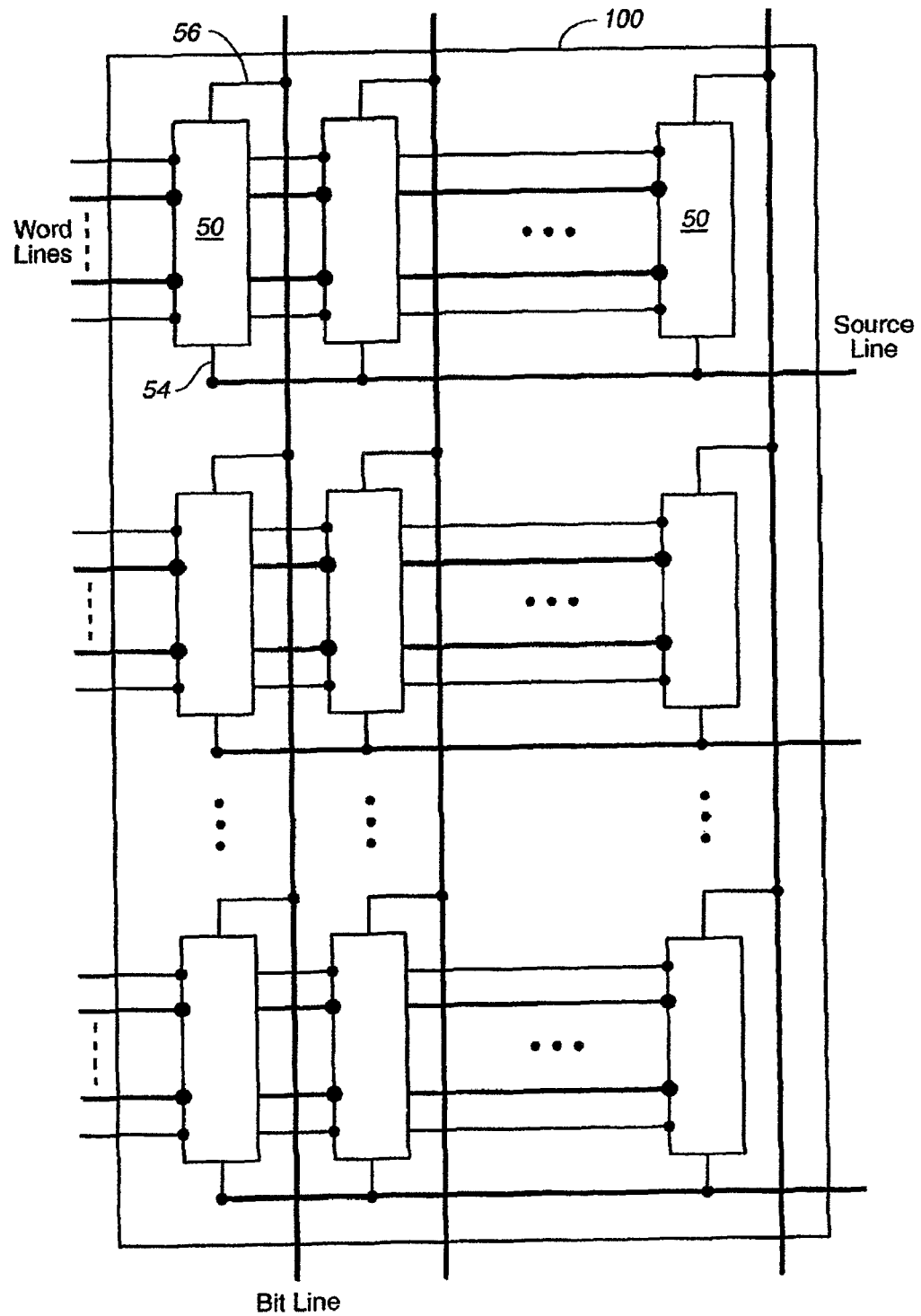
FIG. 3 illustrates an example of an NAND array of memory cells, such as that shown in FIG. 1D.

If a repeated data pattern is stored into certain pages, either by a user or a controller, then the data may line up certain patterns which are detrimental to the boosting mode during programming for some NAND chain. When a number of NAND chains (see FIG. 1D and FIG. 3) share a selected word line during programming, the chains not to be programmed are program-inhibited by having their channel region boosted so as to reduce the effective programming voltage applied to the selected word line. For example, a NAND type memory typically has each NAND chain programmed from the source side to the drain side. If a number of the memory cells on the source side are in the erased state, the boosted channel on the drain side during program-inhibition will not be very efficient as charges from the boosted channel may leak towards the source via the highly conductive channel created by the erased cells. The less than effective channel boosting and therefore program inhibition may cause program disturb and erroneous results. Issues with boosting efficiency are discussed in U.S. Application Publication No. US-2006-0198195-A1 and U.S. application Ser. No. 11/618,482 filed on Dec. 29, 2006, entitled "Method of NAND Flash Memory Cell Array with Adaptive Memory State Partitioning," by Farookh Moogat, et al, which entire disclosures are incorporated herein by reference.

According to one aspect of the invention, the data in the page is randomized such that when data from several pages are lined up problematic data patterns are avoided during programming.

Scrambling by Shifting Starting Location of Each Page

In one preferred embodiment, a simple way of scrambling the data on a page is to write the data on an independent or different starting address for each different page. A corresponding page of data is written to each page of memory cells at a different starting location for each page. When the data is filled to the end of the page, it continues by wrapping around from the first address of the page until just before the starting location.

Figure 26:
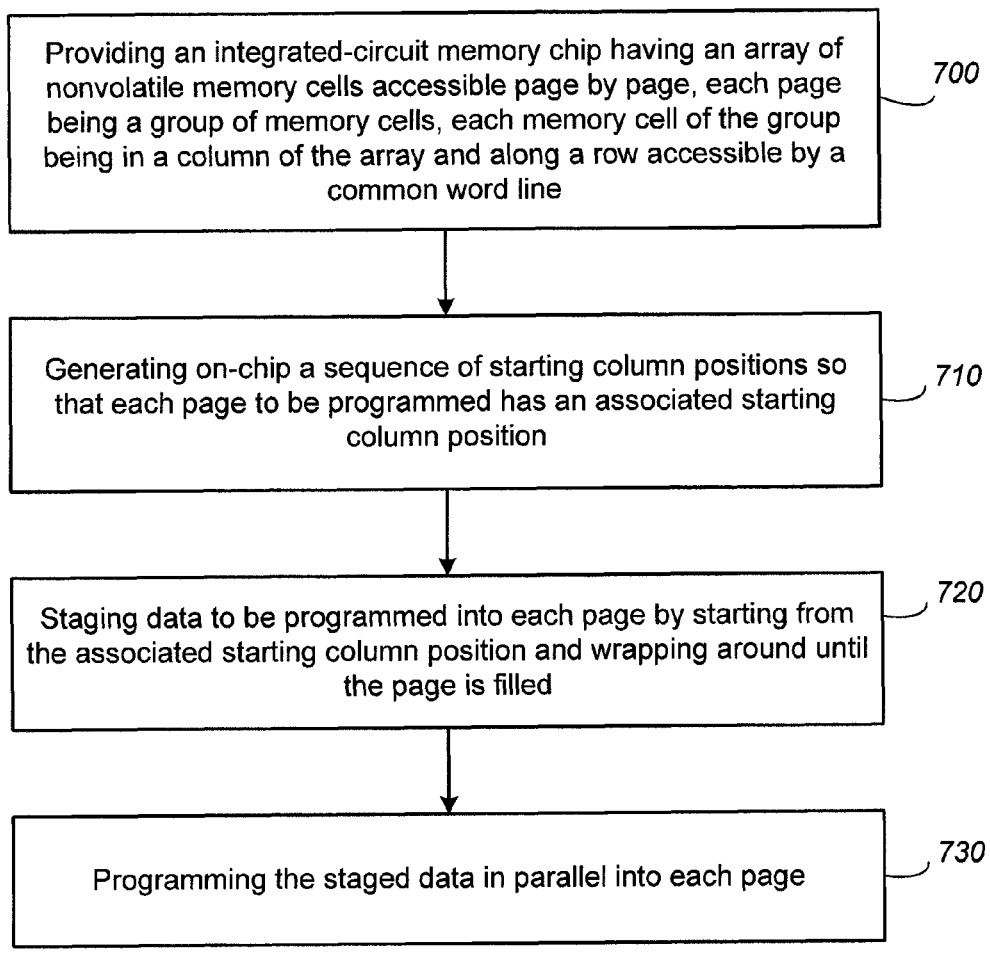
FIG. 26 illustrates a method of scrambling the data on a memory page, according to one preferred embodiment of writing from different starting location for each page.

FIG. 26 illustrates a method of scrambling the data on a memory page, according to one preferred embodiment of writing from different starting location for each page.

STEP 700: Providing an integrated-circuit memory chip having an array of nonvolatile memory cells accessible page by page, each page being a group of memory cells, each memory cell of the group being in a column of the array and along a row accessible by a common word line.

STEP 710: Generating on-chip a sequence of starting column positions so that each page to be programmed has an associated starting column position.

STEP 720: Staging data to be programmed into each page by starting from the associated starting column position and wrapping around until the page is filled.

STEP 730: Programming the staged data in parallel into each page.

FIG. 27 is a table illustrating an example of different pages having different starting locations for writing data. For example, on Page 0, byte 0 will be loaded starting from Column 0. On Page 1, byte 0 will be loaded starting from Column 1. The data will continue to load through Column n−1 and wrapped back to Column 0. In this example, each page has a designated shift to help misalign any repeated pattern in the data from page to page. In general, the starting column address is given as function of the page number. When the end of the physical column is reached, the data wraps around to the beginning of the physical column. For example.

Starting_Column_Address(Page_Number)=Page_Number (MOD (n−1))+k, where k is a predetermined number and (n−1) is the total number of memory cells being programmed in parallel. For example, when k=0, each page is shifted by one column from the previous page.

In a preferred embodiment, the shifting of the starting column position for a given page is implemented by controlling the I/O circuits 440 shown in FIG. 9. Typically the address decoder 314 issues the starting address of the physical page to the I/O circuit in a data load operation. Data is clocked into the I/O circuit column by column according to the starting address. In the case of wrapping around, a second starting address is issued when the end of the physical column is reached.

FIG. 23D illustrates the starting column address for each page can be stored in a portion of the page reserved for system use. For example, the starting column address for page 630 is stored in a portion 634 of the memory array.

In another preferred embodiment, a sequence of starting physical column addresses, one for each page, is provided by a pseudo-random generator such as that shown in FIG. 23A.

Shifting the starting position of each page can avoid undesirable data patterns to line up within NAND chains and help to alleviate boosting problems during programming.

In addition to alleviating channel boosting issues during programming, scrambling of data within a page also helps to control the source loading error during sensing.

The source loading errors are introduced by a finite resistance between the source line and the ground pad of the chip. One potential problem with sensing memory cells is source line bias caused by source loading across the finite resistance. When a large number memory cells are sensed in parallel, their combined currents can result in significant voltage drop in a ground loop with finite resistance. This results in a source line bias which causes errors in a read operation employing threshold voltage sensing.

Figure 28A:
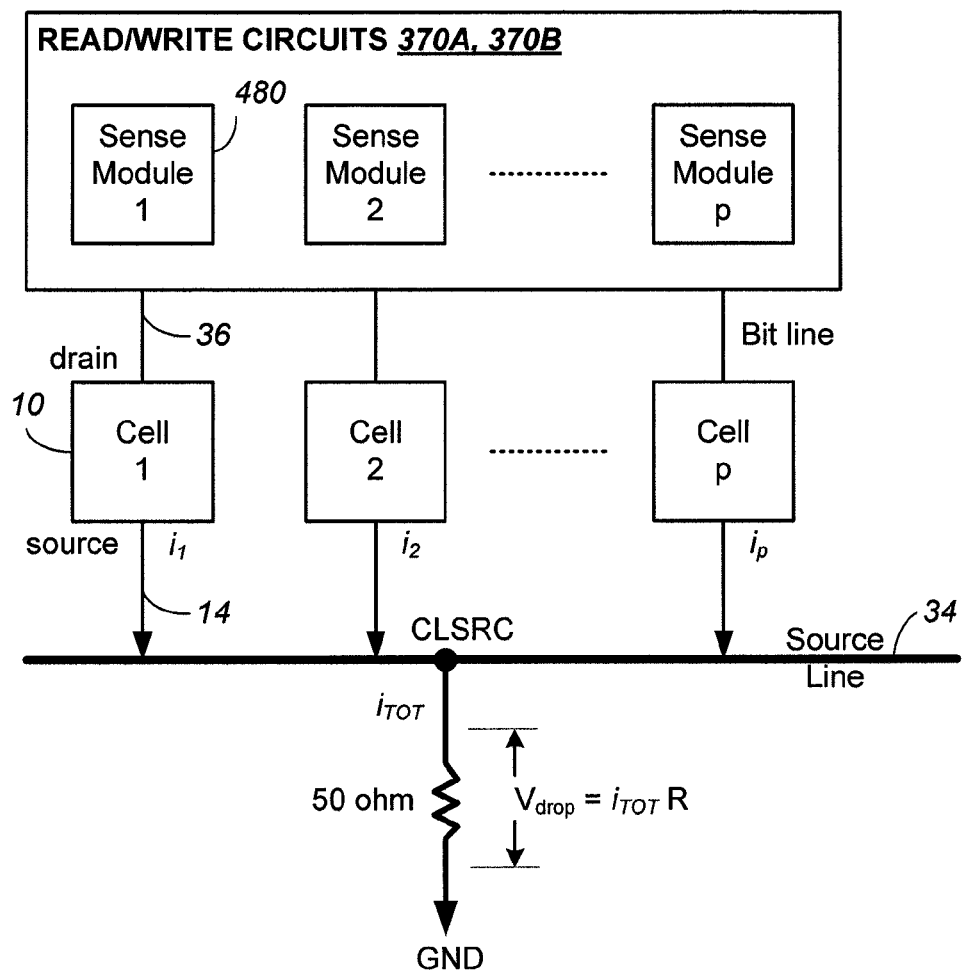
FIG. 28A illustrates the problem of source voltage error due to current flow in the source line having a finite resistance to ground.

FIG. 28A illustrates the problem of source voltage error due to current flow in the source line having a finite resistance to ground. The read/write circuits 370A and 370B operate on a page of memory cells simultaneously. Each sense modules 480 in the read/write circuits is coupled to a corresponding cell via a bit line 36. In terms of the read/write stack 400 shown in FIG. 8, each sense module 480 includes a sense amplifier 212 connected to one of the bit lines, a set of data latches 430 and sharing the common processor 500 and I/O circuits 440. There will be a sense module for each of the memory cells in a page for parallel operation.

For example, a sense module 480 senses the conduction current $i_1$ (source-drain current) of a memory cell 10. The conduction current flows from the sense module through the bit line 36 into the drain of the memory cell 10 and out from the source 14 before going through a source line 34 to ground. In an integrated circuit chip, the sources of the cells in a memory array are all tied together as multiple branches of the source line 34 connected to some external ground pad (e.g. Vss pad) of the memory chip. Even when metal strapping is used to reduce the resistance of the source line, a finite resistance, R, remains between the source electrode of a memory cell and the ground pad. Typically, the ground loop resistance R is around 10 ohm.

Figure 4:
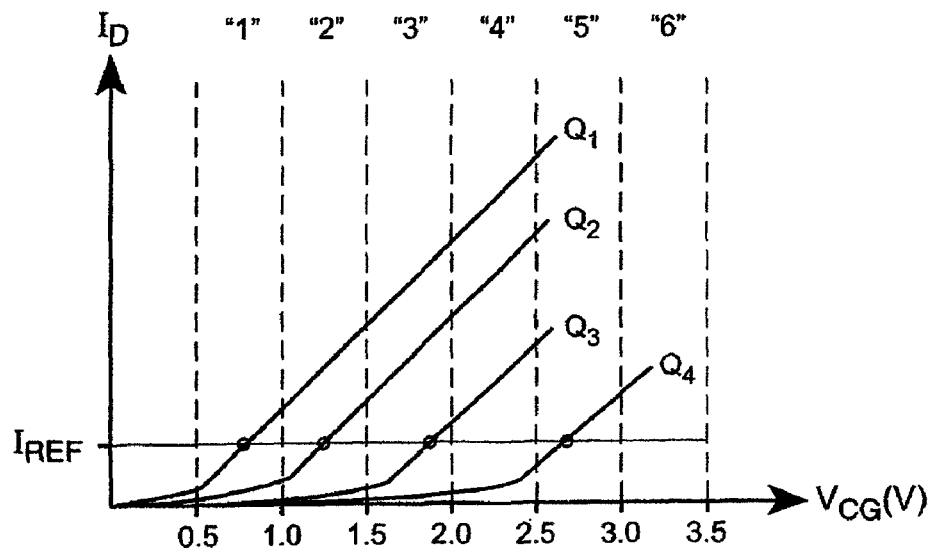
FIG. 4 illustrates the relation between the source-drain current and the control gate voltage for four different charges Q1-Q4 that the floating gate may be storing at any one time.
Figure 5:
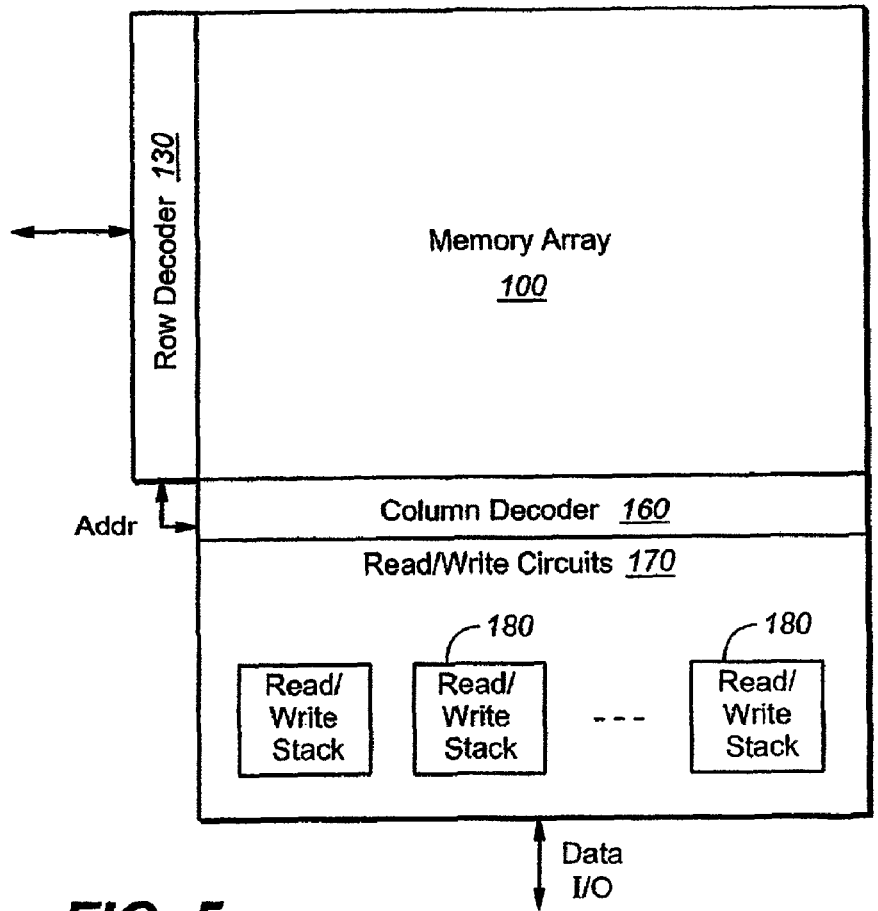
FIG. 5 illustrates schematically a typical arrangement of a memory array accessible by read/write circuits via row and column decoders.
Figure 6A:
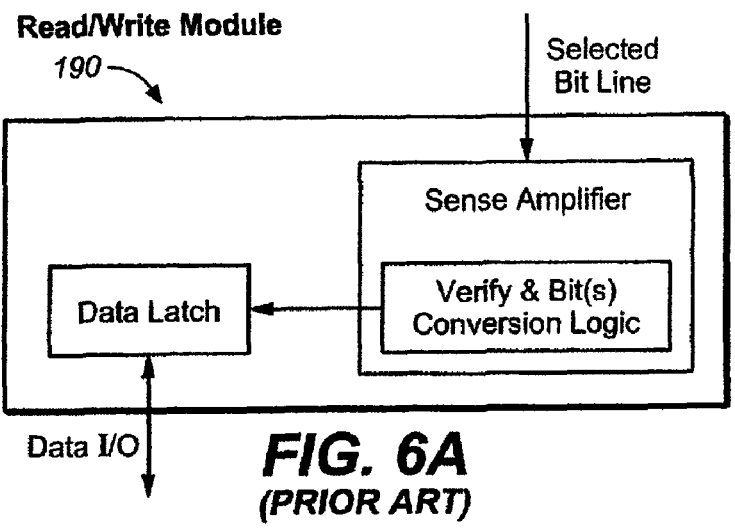
FIG. 6A is a schematic block diagram of an individual read/write module.
Figure 6B:
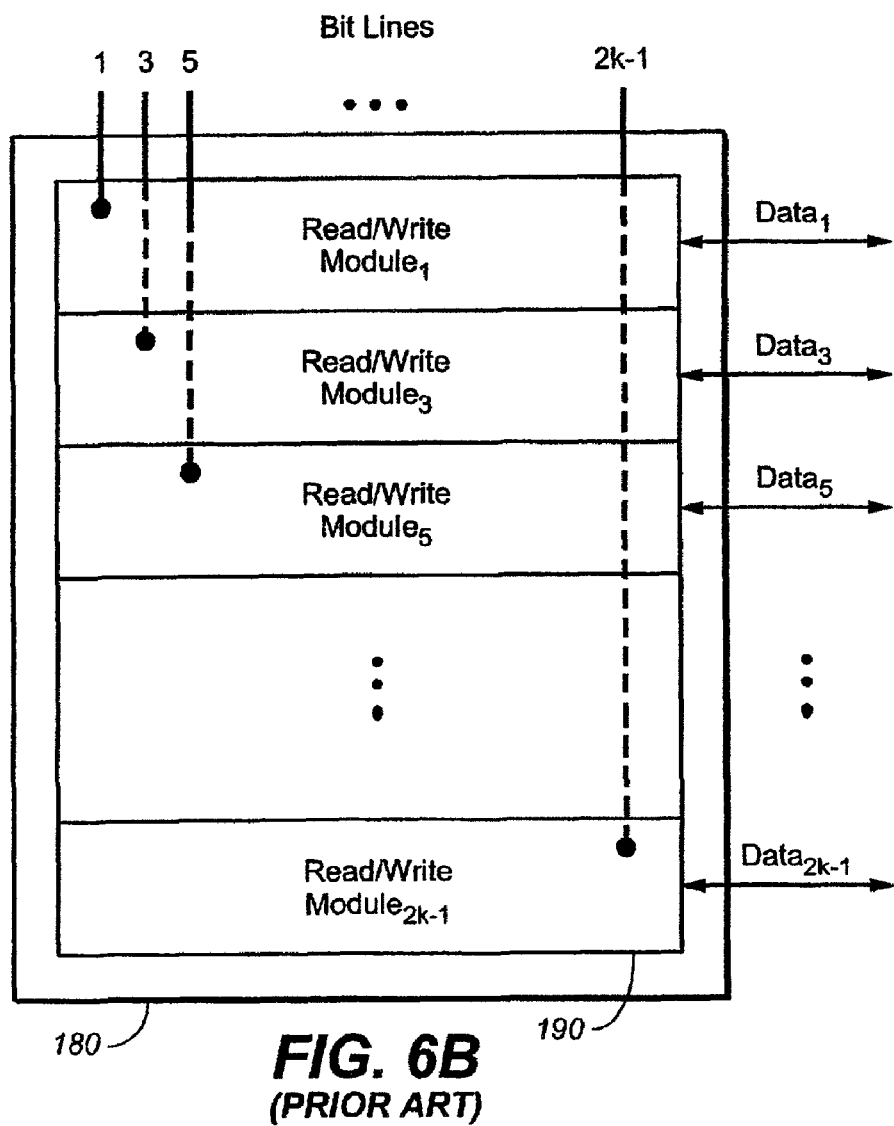
FIG. 6B shows the read/write stack of FIG. 5 implemented conventionally by a stack of read/write modules.

For the entire page of memory being sensed in parallel, the total current flowing through the source line 34 is the sum of all the conduction currents, i.e. $i_{TOT}=i_1+i_2+\ldots,+i_p$. Generally each memory cell has a conduction current dependent on the amount of charge programmed into its charge storage element. For a given control gate voltage of the memory cell, a small charge will yield a comparatively higher conduction current (see FIG. 4.) When a finite resistance exists between the source electrode of a memory cell and the ground pad, the voltage drop across the resistance is given by $V_{drop}=i_{TOT}R$.

For example, if 64000 bit lines discharge at the same time, each with a current of 1 μA, then the source line voltage drop will be equal to 64000 lines×1 μA/line×10 ohms~0.64 volts. This source line bias will contribute to a sensing error of 0.96 volts when threshold voltages of the memory cells are sensed, assuming that the body effect is such that 0.64V rise in source voltage results in a 0.96V rise in threshold voltage.

Figure 28B:
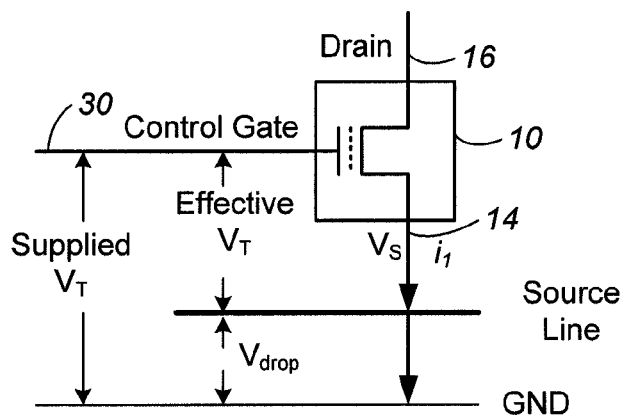
FIG. 28B illustrates the error in the threshold voltage level of a memory cell caused by a source line voltage drop.

FIG. 28B illustrates the error in the threshold voltage level of a memory cell caused by a source line voltage drop. The threshold voltage $V_T$ supplied to the control gate 30 of the memory cell 10 is relative to GND. However, the effective $V_T$ seen by the memory cell is the voltage difference between its control gate 30 and source 14. There is a difference of approximately $1.5 \times V_{drop}$ between the supplied and effective $V_T$ (ignoring the smaller contribution of voltage drop from the source 14 to the source line.) This $V_{drop}$ or source line bias will contribute to a sensing error of, for example, 0.96 volts when threshold voltages of the memory cells are sensed.

The bias cannot be easily removed as it is data-dependent, i.e., dependent on the memory states of the memory cells of the page. The bias is highest in one extreme case when all the memory cells of the page are in the erased state. In this case, each cell is highly conductive, contributing to a large $V_{drop}$ and therefore a high source line bias. On the other hand, in the other extreme, when all the memory cells in the page are in the most programmed state, then each cell is non conductive, resulting in a minimum or no source line bias.

According to another aspect of the invention, the data bits in the page are randomized such that on average the page contains an equal mix of cells with erased and programmed states. In this way, the source line bias or loading does not vary substantially and can be allowed for with appropriate adjustment during the sensing operation.

This is accomplished by randomizing the individual bits within a page. Preferably, a sequence of pseudo random bits, each specifying a certain polarity is employed to encode bits within the page. In one embodiment, there is a polarity bit for each data bit in the page. In another embodiment, there is a polarity bit for each byte of data in the page. In this embodiment, if the polarity bit specifies a flipping of the bits, then all bits within the data byte will get flipped.

Figure 29:
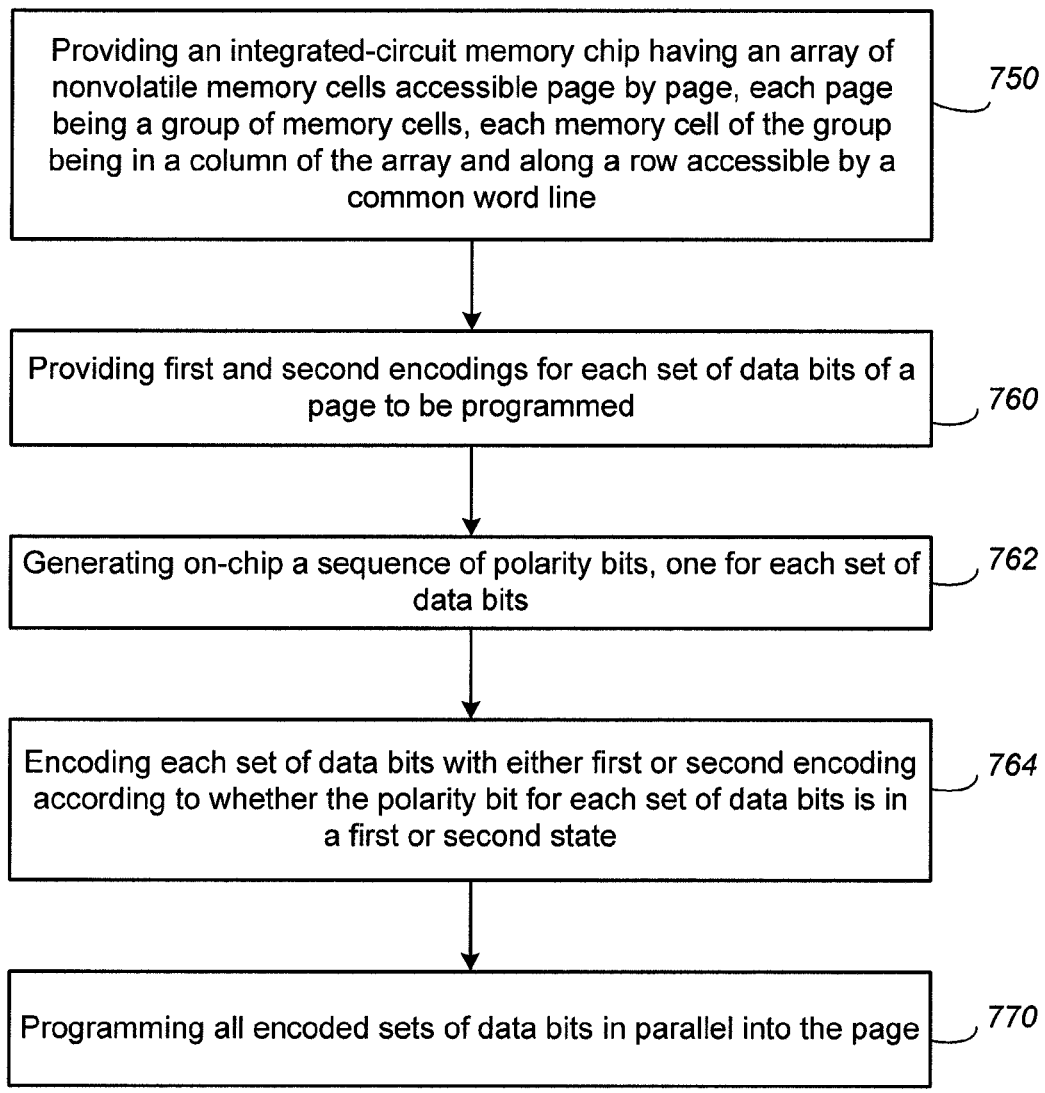
FIG. 29 illustrates a method of randomizing bits within a page.

FIG. 29 illustrates a method of randomizing bits within a page.

STEP 750: Providing an integrated-circuit memory chip having an array of nonvolatile memory cells accessible page by page, each page being a group of memory cells, each memory cell of the group being in a column of the array and along a row accessible by a common word line.

STEP 760: Providing first and second encodings for each set of data bits of a page to be programmed.

STEP 762: Generating on-chip a sequence of polarity bits, one for each set of data bits.

STEP 764: Encoding each set of data bits with either first or second encoding according to whether the polarity bit for each set of data bits is in a first or second state.

STEP 770: Programming all encoded sets of data bits in parallel into the page.

The sequence of polarity bits, one for each set of data bits, is preferably provided by a pseudo-random generator such as that shown in FIG. 23A. Each set of data bits contains a predetermined number of bits. For example, in one embodiment, the predetermined number of bits is one. In another embodiment, the predetermined number of bits is 8 bits.

On-Chip Pseudo-Randomization of Data within a Page and Between Pages

For some extremely regular data pattern, such as pages with all erased states, the scheme of scrambling within a page is not sufficient.

According to another aspect of the invention, randomization within a page is combined with randomization form page to page. In particular, given the limited resource of the on-chip circuitry, randomization within a page is preferably accomplished by each page having an independent starting position and randomization from page to page is preferably accomplished by each page having an independent encoding polarity.

Figure 30:
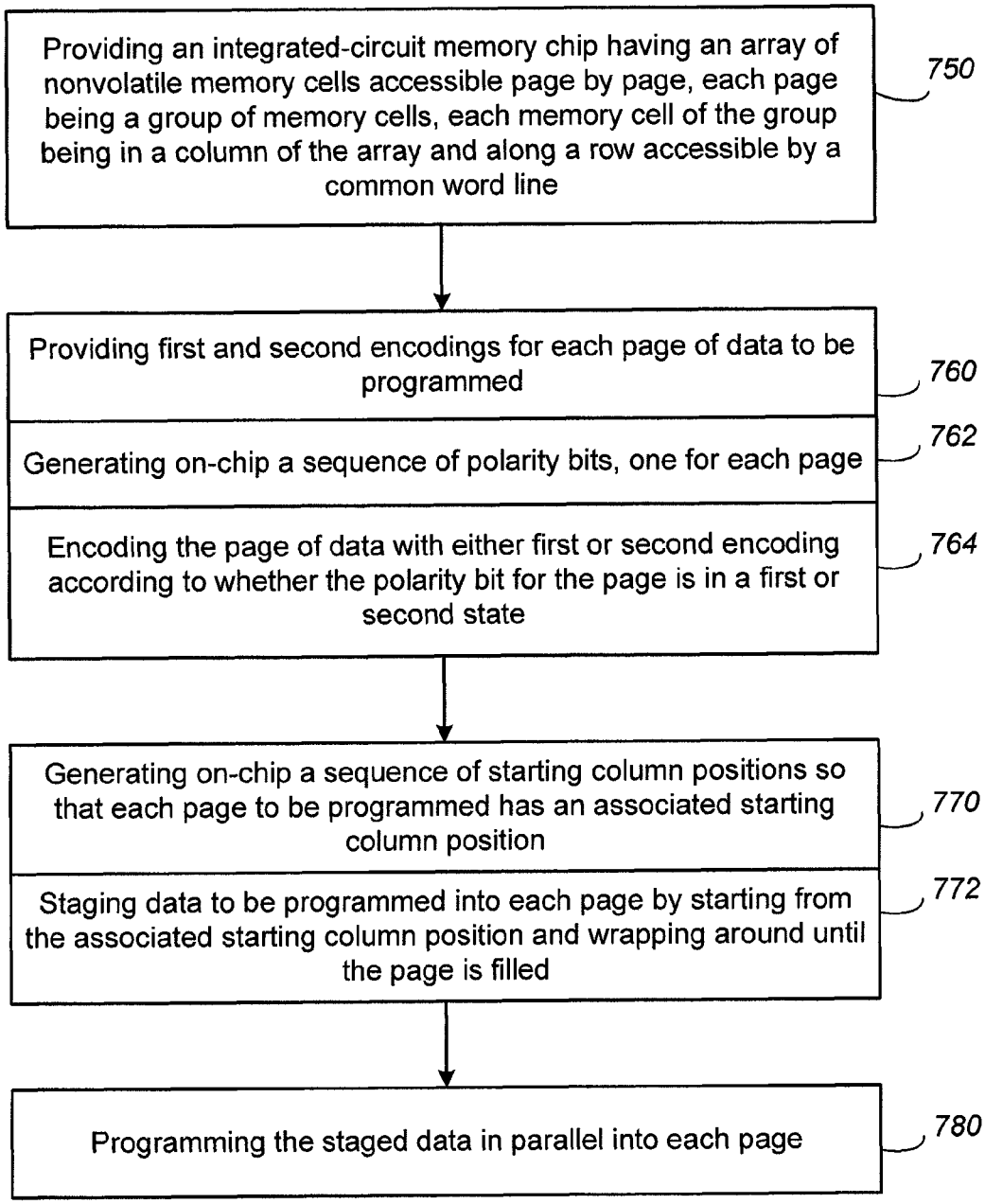
FIG. 30 illustrates a method of randomizing data page-by-page and within each page, according to another aspect of the invention.

FIG. 30 illustrates a method of randomizing data page-by-page and within each page, according to another aspect of the invention.

STEP 800: Providing an integrated-circuit memory chip having an array of nonvolatile memory cells accessible page by page, each page being a group of memory cells, each memory cell of the group being in a column of the array and along a row accessible by a common word line.

STEP 810: Providing first and second encodings for each page of data to be programmed.

STEP 812: Generating on-chip a sequence of polarity bits, one for each page.

STEP 814: Encoding the page of data with either first or second encoding according to whether the polarity bit for the page is in a first or second state.

STEP 820: Generating on-chip a sequence of starting column positions so that each page to be programmed has an associated starting column position.

STEP 822: Staging data to be programmed into each page by starting from the associated starting column position and wrapping around until the page is filled.

STEP 830: Programming the staged data in parallel into each page.

In yet another embodiment, the data bits randomization within a page is also implemented by inserting STEP 760, STEP 762 and STEP 764 shown in FIG. 29 among STEP 810 to STEP 822. In this embodiment, the bits in the word line direction and in the column direction are both randomized.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

While embodiments of the invention have been described, it should be understood that the present invention is not limited to these illustrative embodiments but is defined by the appended claims.

It is claimed:

1. An integrated-circuit memory chip, comprising:
an array of nonvolatile memory cells accessible page by page, each page being a group of memory cells, each memory cell of the group being in a column of the array and along a row accessible by a common word line;
a sequence of non-identical starting column positions so that each page to be programmed has an associated starting column position;
an address generator for generating an address for the associated starting column position;
a set of data latches associated with each column responsive to the address generator for staging data to be programmed into each page, the staged data starting from the associated starting column position and wrapping around until the page is filled; and
a programming circuit to program in parallel the staged data into each page.

2. The memory chip as in claim 1, wherein the pages are numbered consecutively and the starting column position associated with a page is a function of the page number.

3. The memory chip as in claim 2, wherein the function is such that the column position is modulo of the number of cells in the group plus a predetermined number.

4. The memory chip as in claim 3, wherein the predetermined number is zero.

5. The memory chip as in claim 1, further comprising:
a pseudo random generator; and
the sequence of non-identical starting column positions is generated on-chip by the pseudo random generator.

6. The memory chip as in claim 5, wherein:
the pseudo random generator is also responsive to a timing triggered by an event external to the memory chip; and
the sequence of non-identical starting column positions is also a function the timing.

7. The memory chip as in claim 1, further comprising:
first and second encodings for each page of data to be programmed;
a sequence of polarity bits, one for each page; and
an encoder to encode the page of data with either first or second encoding according to whether the polarity bit for the page is in a first or second state.

8. The memory chip as in claim 1, wherein the memory cells of the array are organized in a NAND architecture.

9. An integrated-circuit memory chip, comprising:
an array of nonvolatile memory cells accessible page by page, each page being a group of memory cells, each memory cell of the group being in a column of the array and along a row accessible by a common word line;
first and second encodings for each set of columns in which data is to be programmed;
a sequence of non-identical polarity bits, one for a set of columns of a page;

an encoder to encode the data bits associated with each set of columns with either first or second encoding according to whether the polarity bit for the set of columns is in a first or second state; and a programming circuit to program in parallel the encoded data into each page.

10. The memory chip as in claim 9, wherein the first encoding is to leave the data bit associated with each column unchanged and the second encoding is to flip the data bit.

11. The memory chip as in claim 9, further comprising:

a pseudo random generator; and wherein the sequence of polarity bits is generated by the pseudo random generator.

12. In an integrated-circuit memory chip having an array of nonvolatile memory cells accessible page by page, each page being a group of memory cells, each memory cell of the group being in a column of the array and along a row accessible by a common word line, a method for programming data into the array comprising:

generating on-chip a sequence of non-identical starting column positions so that each page to be programmed has an associated starting column position;

staging data to be programmed into each page by starting from the associated starting column position and wrapping around until the page is filled; and programming the staged data in parallel into each page.

13. The method as in claim 12, wherein the pages are numbered consecutively and the starting column position associated with a page is a function of the page number.

14. The method as in claim 13, wherein the function is such that the column position is modulo of the number of cells in the group plus a predetermined number.

15. The method as in claim 14, wherein the predetermined number is zero.

16. The method as in claim 12, wherein:

the sequence of non-identical starting column positions is generated on-chip by a pseudo random generator.

17. The method as in claim 16, wherein:

the pseudo random generator is also responsive to a timing triggered by an event external to the memory chip; and the sequence of non-identical starting column positions is also a function the timing.

18. The method as in claim 17, wherein the external event is initiated by a user of the memory chip.

19. The method as in claim 17, wherein the external event is initiated by an external memory controller.

20. The method as in claim 12, further comprising:

providing first and second encodings for each page of data to be programmed;

generating on-chip a sequence of non-identical polarity bits, one for each page; and encoding the page of data with either first or second encoding according to whether the polarity bit for the page is in a first or second state.

21. In an integrated-circuit memory chip having an array of nonvolatile memory cells accessible page by page, each page being a group of memory cells, each memory cell of the group being in a column of the array and along a row accessible by a common word line, a method for programming data into the array comprising:

providing first and second encodings for each set of columns in which data is to be programmed;

generating on-chip a sequence of non-identical polarity bits, one for each set of columns of a page;

encoding the data bit associated with each set of columns with either first or second encoding according to whether the polarity bit for each set of columns is in a first or second state; and programming in parallel the encoded data into each page.

22. The method as in claim 21, wherein the first encoding is to leave the data bits associated with each set of columns unchanged and the second encoding is to flip the data bits.

23. The method as in claim 21, wherein the sequence of non-identical polarity bits is generated on-chip by a pseudo random generator.

* * * * *